(12) United States Patent
Feng et al.

(10) Patent No.: US 11,482,170 B2
(45) Date of Patent: Oct. 25, 2022

(54) DISPLAY PANEL AND DISPLAY DEVICE

(71) Applicant: BOE Technology Group Co., Ltd., Beijing (CN)

(72) Inventors: Yu Feng, Beijing (CN); Libin Liu, Beijing (CN); Lujiang Huangfu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/278,713

(22) PCT Filed: May 9, 2020

(86) PCT No.: PCT/CN2020/089467
§ 371 (c)(1),
(2) Date: Mar. 23, 2021

(87) PCT Pub. No.: WO2021/226759
PCT Pub. Date: Nov. 18, 2021

(65) Prior Publication Data
US 2022/0114958 A1 Apr. 14, 2022

(51) Int. Cl.
*G09G 3/3233* (2016.01)
*G09G 3/3258* (2016.01)
(Continued)

(52) U.S. Cl.
CPC ......... *G09G 3/3233* (2013.01); *G09G 3/3258* (2013.01); *H01L 27/12* (2013.01);
(Continued)

(58) Field of Classification Search
None
See application file for complete search history.

(56) References Cited

U.S. PATENT DOCUMENTS

| | | | |
|---|---|---|---|
| 2013/0027382 A1* | 1/2013 | Kato | G09G 3/003 345/212 |
| 2013/0257839 A1 | 10/2013 | Hyeon et al. | |

(Continued)

FOREIGN PATENT DOCUMENTS

| | | |
|---|---|---|
| CN | 106920801 A | 7/2017 |
| CN | 107038997 A | 8/2017 |

(Continued)

*Primary Examiner* — Dorothy Harris
(74) *Attorney, Agent, or Firm* — ArentFox Schiff LLP; Michael Fainberg

(57) ABSTRACT

The display panel includes: a base substrate; a silicon semiconductor layer, the silicon semiconductor layer including active silicon layers of a driving transistor and an initialization transistor, each of the active silicon layers being provided with a first region, a second region and a first channel region therebetween; a first insulating layer, a first conducting layer, a second insulating layer and an oxide semiconductor layer, the oxide semiconductor layer including an active oxide layer of a voltage stabilizing transistor, the oxide semiconductor layer being provided with a third region, a fourth region and a second channel region therebetween. In the same sub-pixel, the second region of the active silicon layer of the initialization transistor is electrically connected to the third region, and the fourth region is electrically connected to a gate electrode of the driving transistor.

19 Claims, 17 Drawing Sheets

(51) Int. Cl.
 *H01L 27/12* (2006.01)
 *H01L 27/32* (2006.01)
(52) U.S. Cl.
 CPC ... *H01L 27/3276* (2013.01); *G09G 2300/043* (2013.01); *G09G 2300/0426* (2013.01); *G09G 2300/0819* (2013.01); *G09G 2300/0842* (2013.01); *G09G 2300/0876* (2013.01)

(56) References Cited

U.S. PATENT DOCUMENTS

| | | | |
|---|---|---|---|
| 2014/0138678 A1 | 5/2014 | Ito et al. | |
| 2017/0148379 A1* | 5/2017 | Cho | G09G 3/3233 |
| 2018/0151115 A1* | 5/2018 | Tseng | G09G 3/325 |
| 2019/0304367 A1 | 10/2019 | Li et al. | |
| 2019/0385523 A1* | 12/2019 | Na | G09G 3/3291 |
| 2020/0111815 A1 | 4/2020 | Lius et al. | |
| 2020/0135104 A1 | 4/2020 | Hou et al. | |
| 2020/0243633 A1 | 7/2020 | Kang et al. | |
| 2020/0302863 A1 | 9/2020 | Xuan et al. | |
| 2021/0020110 A1* | 1/2021 | Park | H01L 27/3262 |
| 2021/0174739 A1 | 6/2021 | Lu et al. | |
| 2021/0280659 A1* | 9/2021 | Park | H01L 27/1248 |

FOREIGN PATENT DOCUMENTS

| | | |
|---|---|---|
| CN | 107068066 A | 8/2017 |
| CN | 110148610 A | 8/2019 |
| CN | 110517639 A | 11/2019 |
| CN | 110767665 A | 2/2020 |
| CN | 110910825 A | 3/2020 |
| CN | 111029359 A | 4/2020 |
| CN | 111128080 A | 5/2020 |
| WO | 2013005604 A1 | 1/2013 |

* cited by examiner

200

DISPLAY PANEL AND DISPLAY DEVICE

CROSS REFERENCE TO RELATED APPLICATIONS

This application is a national phase entry under 35 U.S.C. § 371 of International Application No. PCT/CN2020/089467, filed on May 9, 2020, the entire content of which is incorporated herein by reference.

FIELD

This disclosure relates to the technical field of display, in particular to a display panel and a display device.

BACKGROUND

An electroluminescent diode such as an OLED (Organic Light Emitting Diode) and a QLED (Quantum Dot Light Emitting Diode) has the advantages of self luminescence and low energy consumption so as to become one of hot spots in the field of application research of electroluminescent display devices at present.

SUMMARY

Embodiments of the disclosure provide a display panel, including:

a base substrate, provided with a plurality of sub-pixels, at least one of the plurality of sub-pixels including a pixel circuit, here the pixel circuit includes a driving transistor, an initialization transistor and a voltage stabilizing transistor;

a silicon semiconductor layer, on the base substrate, the silicon semiconductor layer including an active silicon layer of the driving transistor and an active silicon layer of the initialization transistor, here the active silicon layer is provided with a first region, a second region and a first channel region between the first region and the second region;

a first insulating layer, at a side, facing away from the base substrate, of the silicon semiconductor layer;

a first conducting layer, at a side, facing away from the base substrate, of the first insulating layer, the first conducting layer including a gate electrode of the driving transistor and a gate electrode of the initialization transistor;

a second insulating layer, at a side, facing away from the base substrate, of the first conducting layer;

an oxide semiconductor layer, at a side, facing away from the base substrate, of the second insulating layer, the oxide semiconductor layer including an active oxide layer of the voltage stabilizing transistor, here the active oxide layer is provided with a third region, a fourth region and a second channel region between the third region and the fourth region; and in a same sub-pixel, the second region of the active silicon layer of the initialization transistor is electrically connected to the third region of the active oxide layer of the voltage stabilizing transistor, and the fourth region of the active oxide layer of the voltage stabilizing transistor is electrically connected to the gate electrode of the driving transistor.

Optionally, in embodiments of the present disclosure, the pixel circuit further includes a threshold compensation transistor.

The silicon semiconductor layer further includes an active silicon layer of the threshold compensation transistor.

The first conducting layer further includes a gate electrode of the threshold compensation transistor.

In the same sub-pixel, the second region of the active silicon layer of the threshold compensation transistor is electrically connected to the third region of the active oxide layer of the voltage stabilizing transistor, and the first region of the active silicon layer of the threshold compensation transistor is electrically connected to the second region of the active silicon layer of the driving transistor.

Optionally, in embodiments of the present disclosure, the first conducting layer further includes a plurality of first scanning lines, a plurality of second scanning lines and a plurality of third scanning lines spaced from one another. The first scanning lines, the second scanning lines and the third scanning lines extend in a first direction and are arranged in a second direction.

An orthographic projection of each of the first scanning lines on the base substrate is overlapped with an orthographic projection of the first channel region of the active silicon layer of the initialization transistor on the base substrate to form a first overlapping region, and a part, in the first overlapping region, of the each of the first scanning lines is the gate electrode of the initialization transistor.

An orthographic projection of each of the second scanning lines on the base substrate is overlapped with an orthographic projection of the second channel region of the active oxide layer of the voltage stabilizing transistor on the base substrate to form a second overlapping region, and a part, in the second overlapping region, of the each of the second scanning lines is an gate electrode of the voltage stabilizing transistor.

An orthographic projection of each of the third scanning lines on the base substrate is overlapped with an orthographic projection of the first channel region of the active silicon layer of the threshold compensation transistor on the base substrate to form a third overlapping region, and a part, in the third overlapping region, of the each of the third scanning lines is the gate electrode of the threshold compensation transistor.

Optionally, in embodiments of the present disclosure, a row of sub-pixels includes the first scanning line, the second scanning line and the third scanning line.

In the same sub-pixel, the orthographic projection of the second scanning line on the base substrate is between the orthographic projection of the first scanning line on the base substrate and the orthographic projection of the third scanning line on the base substrate, an orthographic projection of the active oxide layer of the voltage stabilizing transistor on the base substrate is between the orthographic projection of the first scanning line on the base substrate and the orthographic projection of the third scanning line on the base substrate, and the orthographic projection of the second scanning line on the base substrate is respectively not overlapped with an orthographic projection of the active silicon layer of the threshold compensation transistor on the base substrate and an orthographic projection of the active silicon layer of the initialization transistor on the base substrate.

Optionally, in embodiments of the present disclosure, the active oxide layer of the voltage stabilizing transistor extends approximately in a straight line in the second direction.

The active silicon layer of at least one of the initialization transistor and the threshold compensation transistor extends approximately in a straight line in the second direction.

Optionally, in embodiments of the present disclosure, the display panel further includes:

a third insulating layer, at a side, facing away from the base substrate, of the oxide semiconductor layer;

a second conducting layer, at the side, facing away from the base substrate, of the third insulating layer;

a fourth insulating layer, at a side, facing away from the base substrate, of the second conducting layer; and a third conducting layer, at a side, facing away from the base substrate, of the fourth insulating layer, and the third conducting layer including a plurality of data lines spaced from one another, here a column of sub-pixels includes a data line; and in a same column of sub-pixels, both the orthographic projection of the active silicon layer of the initialization transistor on the base substrate and the orthographic projection of the active silicon layer of the threshold compensation transistor on the base substrate are at a side, facing away from an orthographic projection of the data line on the base substrate, of the orthographic projection of the active oxide layer of the voltage stabilizing transistor on the base substrate.

Optionally, in embodiments of the present disclosure, the third conducting layer further includes a plurality of first connection parts; one of the sub-pixels includes a first connection part.

The sub-pixel further includes a first via hole, a second via hole and a third via hole spaced from one another. The first via hole penetrates through the third insulating layer and the fourth insulating layer, and both the second via hole and the third via hole penetrate through the first insulating layer, the second insulating layer, the third insulating layer and the fourth insulating layer.

In the same sub-pixel, the first connection part is electrically connected to the third region of the active oxide layer of the voltage stabilizing transistor through the first via hole, the first connection part is electrically connected to the second region of the active silicon layer of the initialization transistor through the second via hole, and the first connection part is electrically connected to the second region of the active silicon layer of the threshold compensation transistor through the third via hole.

Optionally, in embodiments of the present disclosure, an orthographic projection of the first connection part on the base substrate is approximately T-shaped.

Optionally, in embodiments of the present disclosure, in the same sub-pixel, the first via hole, the second via hole and the third via hole are approximately arranged in a triangle.

Optionally, in embodiments of the present disclosure, in the same sub-pixel, the first via hole and the second via hole extend approximately in a straight line in the first direction, and an orthographic projection of the third via hole on the straight line where the first via hole and the second via hole are located is close to the second via hole.

Optionally, in embodiments of the present disclosure, the first connection part includes a first sub-connection part and a second sub-connection part electrically connected to each other.

A first end of the first sub-connection part is electrically connected to the third region of the active oxide layer of the voltage stabilizing transistor through the first via hole, and a second end of the first sub-connection part is electrically connected to the second region of the active silicon layer of the initialization transistor through the second via hole.

A first end of the second sub-connection part is electrically connected to the second region of the active silicon layer of the threshold compensation transistor through the third via hole, and a second end of the second sub-connection part is electrically connected to the first sub-connection part.

Optionally, in embodiments of the present disclosure, the first sub-connection part extends in the first direction, and the second sub-connection part extends in the second direction.

In a same row of sub-pixels, an orthographic projection of the first sub-connection part on the base substrate is between the orthographic projection of the first scanning line on the base substrate and the orthographic projection of the second scanning line on the base substrate, and an orthographic projection of the second sub-connection part on the base substrate is overlapped with the orthographic projection of the second scanning line on the base substrate to form an overlapping region.

Optionally, in embodiments of the present disclosure, the second conducting layer includes a plurality of auxiliary scanning lines spaced from one another; a row of sub-pixels includes an auxiliary scanning line.

In the same sub-pixel, an orthographic projection of the auxiliary scanning line on the base substrate is overlapped with the orthographic projection of the second channel region of the active oxide layer of the voltage stabilizing transistor on the base substrate to form a fourth overlapping region.

The voltage stabilizing transistor is a double-gate transistor. The part, in the second overlapping region, of the second scanning line is a first gate electrode of the voltage stabilizing transistor, and a part, in the fourth overlapping region, of the auxiliary scanning line is a second gate electrode of the voltage stabilizing transistor.

Optionally, in embodiments of the present disclosure, in the same sub-pixel, the orthographic projection of the auxiliary scanning line on the base substrate is overlapped with the orthographic projection of the second scanning line on the base substrate, and the auxiliary scanning line and the second scanning line in the same sub-pixel are electrically connected.

Optionally, in embodiments of the present disclosure, the third conducting layer further includes a plurality of power lines spaced from the data lines and second connection parts. A column of sub-pixels includes a power line.

In the same sub-pixel, an orthographic projection of the power line on the base substrate is between the orthographic projection of the data line on the base substrate and an orthographic projection of the second connection part on the base substrate.

Optionally, in embodiments of the present disclosure, the sub-pixel further includes a first light emitting control transistor and a second light emitting control transistor as well as a fourth via hole and a fifth via hole spaced from each other. Both the fourth via hole and the fifth via hole penetrate through the first insulating layer, the second insulating layer, the third insulating layer and the fourth insulating layer.

The silicon semiconductor layer further includes an active silicon layer of the first light emitting control transistor and an active silicon layer of the second light emitting control transistor.

The first conducting layer further includes a gate electrode of the first light emitting control transistor and a gate electrode of the second light emitting control transistor.

In the same sub-pixel, the power line is electrically connected to the first region of the active silicon layer of the first light emitting control transistor through the fourth via hole, the second region of the active silicon layer of the first light emitting control transistor is electrically connected to the first region of the active silicon layer of the driving transistor, the first region of the active silicon layer of the second light emitting control transistor is electrically connected to the second region of the active silicon layer of the driving transistor, and the second region of the active silicon layer of the second light emitting control transistor is electrically connected to a first electrode of a light emitting device through the fifth via hole.

Optionally, in embodiments of the present disclosure, the first conducting layer further includes a plurality of light emitting control lines and a plurality of fourth scanning lines spaced from each other. A row of sub-pixels includes a light emitting control line and a fourth scanning line.

In the same sub-pixel, an orthographic projection of the light emitting control line on the base substrate is at a side, facing away from the orthographic projection of the second scanning line on the base substrate, of the orthographic projection of the third scanning line on the base substrate, an orthographic projection of the fourth scanning line on the base substrate is a side, facing away from the orthographic projection of the second scanning line on the base substrate, of the orthographic projection of the light emitting control line on the base substrate, and both orthographic projections of the active silicon layer and the gate electrode of the driving transistor on the base substrate are between the orthographic projection of the light emitting control line on the base substrate and the orthographic projection of the third scanning line on the base substrate.

The orthographic projection of the light emitting control line on the base substrate is overlapped with the first channel region of the active silicon layer of the first light emitting control transistor to form a fourth overlapping region, and a part, in the fourth overlapping region, of the light emitting control line is the gate electrode of the first light emitting control transistor.

The orthographic projection of the light emitting control line on the base substrate is overlapped with the first channel region of the active silicon layer of the second light emitting control transistor to form a fifth overlapping region, and a part, in the fifth overlapping region, of the light emitting control line is the gate electrode of the second light emitting control transistor.

Optionally, in embodiments of the present disclosure, the third conducting layer further includes a plurality of second connection parts spaced from the data lines and the power lines. One of the sub-pixels includes a second connection part.

The sub-pixel further includes a sixth via hole and a seventh via hole. The sixth via hole penetrates through the third insulating layer and the fourth insulating layer, and the seventh via hole penetrates through the second insulating layer, the third insulating layer and the fourth insulating layer.

The second connection part is electrically connected to the fourth region of the active oxide layer of the voltage stabilizing transistor through the sixth via hole, and the second connection part is electrically connected to the gate electrode of the driving transistor through the seventh via hole.

Optionally, in embodiments of the present disclosure, the second connection part includes a first conducting part and a first main part. The first conducting part is electrically connected to the fourth region of the active oxide layer of the voltage stabilizing transistor through the sixth via hole.

An orthographic projection of the first conducting part on the base substrate is respectively overlapped with the orthographic projection of the third scanning line on the base substrate and an orthographic projection of the fourth region of the active oxide layer of the voltage stabilizing transistor on the base substrate to form overlapping regions.

An orthographic projection of the first main part on the base substrate is overlapped with an orthographic projection of the gate electrode of the driving transistor on the base substrate to form an overlapping region, and the orthographic projection of the first main part on the base substrate is not overlapped with the orthographic projection of the third scanning line on the base substrate.

Optionally, in embodiments of the present disclosure, in the same sub-pixel, the orthographic projection of the first main part on the base substrate is at least partially not overlapped with an orthographic projection of the first region of the second light emitting control transistor on the base substrate, the orthographic projection of the first main part on the base substrate is tangent to the orthographic projection of the light emitting control line on the base substrate, the orthographic projection of the first main part on the base substrate is close to the orthographic projection of the power line on the base substrate, and the orthographic projection of the first main part on the base substrate is close to the orthographic projection of the third scanning line on the base substrate.

Optionally, in embodiments of the present disclosure, the sub-pixel further includes a storage capacitor, and the second conducting layer further includes a storage conducting part spaced from the auxiliary scanning lines.

In the same sub-pixel, an orthographic projection of the storage conducting part on the base substrate respectively covers the orthographic projection of the gate electrode of the driving transistor on the base substrate and the orthographic projection of the first main part on the base substrate, the orthographic projection of the storage conducting part on the base substrate is not overlapped with an orthographic projection of the seventh via hole on the base substrate, and the orthographic projection of the storage conducting part on the base substrate is not overlapped with the orthographic projection of the third scanning line on the base substrate.

Optionally, in embodiments of the present disclosure, in the same sub-pixel, the orthographic projection of the storage conducting part on the base substrate is overlapped with the orthographic projection of the power line on the base substrate to form an overlapping region, and the orthographic projection of the storage conducting part on the base substrate is not overlapped with the orthographic projection of the data line on the base substrate.

Optionally, in embodiments of the present disclosure, the sub-pixel further includes an eighth via hole; the eighth via hole penetrates through the fourth insulating layer.

In the same sub-pixel, the power line is electrically connected to the storage conducting part through the eighth via hole.

Optionally, in embodiments of the present disclosure, in the same sub-pixel, orthographic projections of the eighth via hole, the fourth via hole and the fifth via hole on the base substrate are between the orthographic projection of the light emitting control line on the base substrate and the orthographic projection of the fourth scanning line on the base substrate.

Optionally, in embodiments of the present disclosure, the display panel further includes:

a fifth insulating layer, at a side, facing away from the base substrate, of the third conducting layer; and a fourth conducting layer, at a side, facing away from the base substrate, of the fifth insulating layer, and the fourth conducting layer including a plurality of auxiliary conducting parts spaced from one another, here one of the sub-pixels includes an auxiliary conducting part; and in the same sub-pixel, the auxiliary conducting part is electrically connected to the power line.

Optionally, in embodiments of the present disclosure, the auxiliary conducting part includes a second conducting part and a second main part electrically connected to each other.

The second conducting part is electrically connected to the power line.

An orthographic projection of the second main part on the base substrate covers the orthographic projection of the first main part on the base substrate.

Optionally, in embodiments of the present disclosure, the sub-pixel further includes an eleventh via hole; the eleventh via hole penetrates through the fifth insulating layer.

The second conducting part includes a first sub-conducting part and a second sub-conducting part. The first sub-conducting part extends in the first direction, and the second sub-conducting part extends in the second direction; a first end of the first sub-conducting part is electrically connected to the power line through the eleventh via hole, a second end of the first sub-conducting part is electrically connected to a first end of the second sub-conducting part, and a second end of the second sub-conducting part is electrically connected to the second main part.

The orthographic projection of the third scanning line on the base substrate is overlapped with an orthographic projection of the first sub-conducting part on the base substrate to form an overlapping region, and an orthographic projection of the second end of the first sub-conducting part on the base substrate is overlapped with the orthographic projection of the second channel region of the oxide semiconductor layer of the voltage stabilizing transistor on the base substrate to form an overlapping region.

An orthographic projection of the second sub-conducting part on the base substrate is respectively overlapped with an orthographic projection of the sixth via hole on the base substrate and the orthographic projection of the third scanning line on the base substrate to form overlapping regions.

Optionally, in embodiments of the present disclosure, the fourth conducting layer further includes a plurality of initialization lines spaced from one another. A row of sub-pixels includes an initialization line, and in the same sub-pixel, the first region of the active silicon layer of the initialization transistor is electrically connected to the initialization line.

In the same sub-pixel, an orthographic projection of the initialization line on the base substrate is at a side, facing away from the orthographic projection of the second scanning line on the base substrate, of the orthographic projection of the first scanning line on the base substrate.

Optionally, in embodiments of the present disclosure, the third conducting layer further includes a plurality of third connection parts; one of the sub-pixels includes a third connection part.

The sub-pixel further includes a ninth via hole and a tenth via hole spaced from each other. The ninth via hole penetrates through the fifth insulating layer, and the tenth via hole penetrates through the first insulating layer, the second insulating layer, the third insulating layer and the fourth insulating layer.

In the same sub-pixel, the initialization line is electrically connected to the third connection part through the ninth via hole, and the third connection part is electrically connected to the first region of the active silicon layer of the initialization transistor through the tenth via hole.

Embodiments of the present disclosure provide a display device, including the above-mentioned display panel.

DETAILED DESCRIPTION OF THE EMBODIMENTS

In order to make objectives, technical solutions and advantages of the embodiments of the disclosure clearer, the technical solutions in embodiments of the disclosure will be described clearly and completely below in conjunction with accompanying drawings in the embodiments of the disclosure. Obviously, the described embodiments are a part of the embodiments of the disclosure, not all the embodiments. Furthermore, the embodiments in the disclosure and features in the embodiments may be combined with each other without conflicts. Based on the described embodiments of the disclosure, all other embodiments obtained by those of ordinary skill in the art without creative work shall fall within the protective scope of the disclosure.

Unless otherwise defined, technical terms or scientific terms used in the disclosure shall be ordinary meanings as understood by those of ordinary skill in the art of the disclosure. The words "first", "second" and similar terms used in the disclosure do not denote any order, quantity or importance, but are merely used to distinguish different components. The word "comprise" or "include" or the like means that the element or object preceding the word covers the element or object listed after the word and its equivalent, without excluding other elements or objects. The words "connection" or "connected" and the like are not limited to physical or mechanical connection, but may include electrical connection, whether direct or indirect.

It should be noted that the sizes and shapes of all patterns in the accompanying drawings do not reflect real scales, and are merely to illustrate contents of the disclosure. Furthermore, same or similar numerals throughout indicate same or similar elements or elements with same or similar functions.

Figure 1:
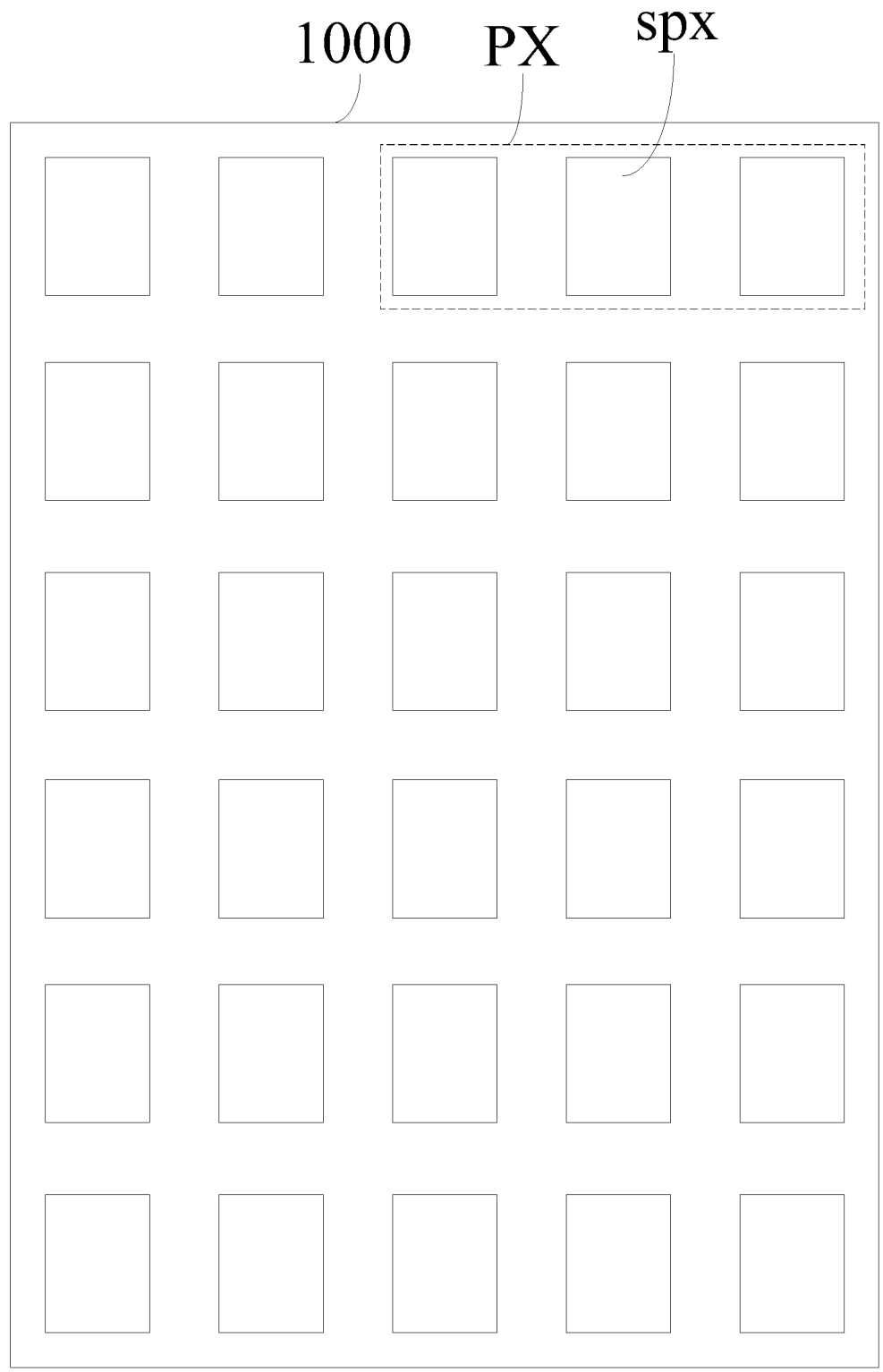
FIG. 1 is a schematic structural diagram of a display panel provided by embodiments of the disclosure.
Figure 2A:
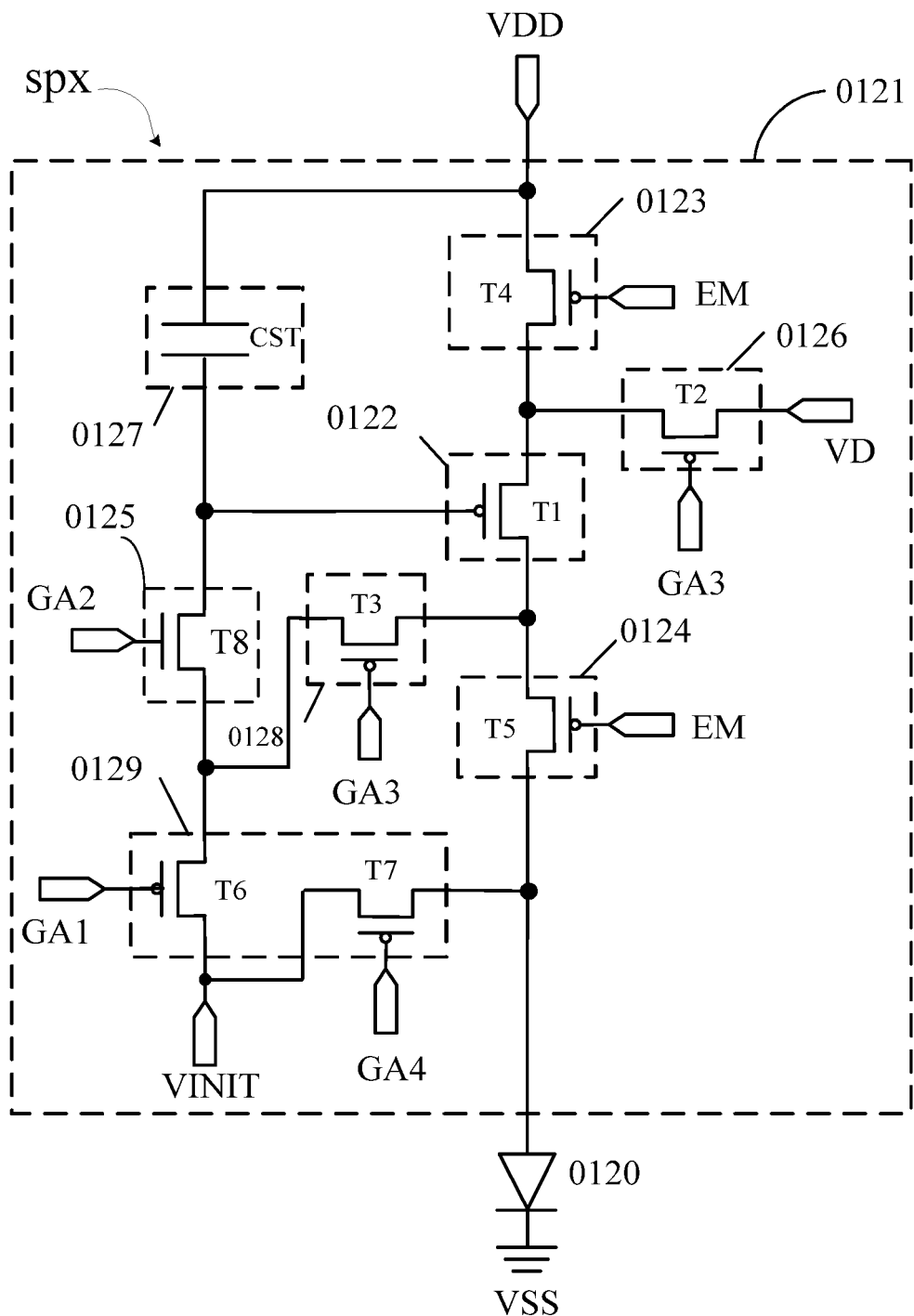
FIG. 2A is a schematic structural diagram of a pixel driving circuit provided by embodiments of the disclosure.

As shown in FIG. 1, a display panel provided by embodiments of the disclosure may include a base substrate 1000, and a plurality of pixel units PX in a display region of the base substrate 1000. Each of the pixel units PX may include a plurality of sub-pixels spx. Exemplarily, as shown in FIG. 1 and FIG. 2A, at least one of the plurality of sub-pixels spx may include a pixel driving circuit 0121 and a light emitting device 0120. The pixel driving circuit 0121 is provided with a transistor and a capacitor. An electric signal is generated by the interaction of the transistor and the capacitor, and the generated electric signal is input to a first electrode of the light emitting device 0120. Moreover, a second electrode of the light emitting device 0120 is loaded with a corresponding voltage to drive the light emitting device 0120 to emit light.

As shown FIG. 2A, the pixel driving circuit 0121 may include a driving control circuit 0122, a first light emitting control circuit 0123, a second light emitting control circuit 0124, a voltage stabilizing circuit 0125, a data writing circuit 0126, a storage circuit 0127, a threshold compensation circuit 0128 and a reset circuit 0129.

The driving control circuit 0122 may include a control end, a first end and a second end. Moreover, the driving control circuit 0122 is configured to provide a driving current for the light emitting device 0120 to drive the light emitting device 0120 to emit light. For example, the first light emitting control circuit 0123 is connected to the first end of the driving control circuit 0122 and a first voltage end VDD. Moreover, the first light emitting control circuit 0123 is configured to realize the connection or disconnection between the driving control circuit 0122 and the first voltage end VDD.

The second light emitting control circuit 0124 is electrically connected to the second end of the driving control circuit 0122 and the first electrode of the light emitting device 0120. Moreover, the second light emitting control circuit 0124 is configured to realize the connection or disconnection between the driving control circuit 0122 and the light emitting device 0120.

The voltage stabilizing circuit 0125 is electrically connected to the control end of the driving control circuit 0122, the reset circuit 0129 and the threshold compensation circuit 0128 respectively, and the voltage stabilizing circuit 0125 is configured to connect the control end of the driving control circuit 0122 with the reset circuit 0129 to reset the control end of the driving control circuit 0122. The voltage stabilizing circuit 0125 is configured to connect the control end of the driving control circuit 0122 with the threshold compensation circuit 0128 so as to perform threshold compensation.

The data writing circuit 0126 is electrically connected to the first end of the driving control circuit 0122. Moreover, the data writing circuit 0126 is configured to write a signal on a data line VD into the storage circuit 0127.

The storage circuit 0127 is electrically connected to the control end of the driving control circuit 0122 and the first voltage end VDD. Moreover, the storage circuit 0127 is configured to store a data signal.

The threshold compensation circuit 0128 is electrically connected to the voltage stabilizing circuit 0125 and the second end of the driving control circuit 0122. Moreover, the threshold compensation circuit 0128 is configured to perform threshold compensation on the driving control circuit 0122.

The reset circuit 0129 is further electrically connected to the first electrode of the light emitting device 0120. Moreover, the reset circuit 0129 is configured to reset the first electrode of the light emitting device 0120 and provide a signal transmitted on an initialization line VINIT to the voltage stabilizing circuit 0125 so as to reset the control end of the driving control circuit 0122 when the control end of the driving control circuit 0122 is connected with the reset circuit 0129 by the voltage stabilizing circuit 0125.

The light emitting device 0120 may be set as an electroluminescent diode such as at least one of an OLED and a QLED. The light emitting device 0120 may include a first electrode, a light emitting functional layer and a second electrode which are stacked. Exemplarily, the first electrode may be an anode, and the second electrode may be a cathode. The light emitting functional layer may include a light emitting layer. Further, the light emitting functional layer may further include film layers such as a hole injection layer, a hole transport layer, a light emitting layer, an electron transfer layer and an electron injection layer. Of course, during actual application, the light emitting device 0120 may be designed and determined according to a demand of an actual application environment, which is not limited herein.

Exemplarily, as shown in FIG. 2A, the driving control circuit 0122 includes a driving transistor T1, the control end of the driving control circuit 0122 includes a gate electrode of the driving transistor T1, the first end of the driving control circuit 0122 includes a first electrode of the driving transistor T1, and the second end of the driving control circuit 0122 includes a second electrode of the driving transistor T1.

Exemplarily, as shown in FIG. 2A, the data writing circuit 0126 includes a data writing transistor T2. The storage circuit 0127 includes a storage capacitor CST. The threshold compensation circuit 0128 includes a threshold compensation transistor T3. The first light emitting control circuit 0123 includes a first light emitting control transistor T4. The second light emitting control circuit 0124 includes a second light emitting control transistor T5. The reset circuit 0129 includes an initialization transistor T6 and a second reset transistor T7. The voltage stabilizing circuit 0125 includes a voltage stabilizing transistor T8.

Specifically, a first electrode of the data writing transistor T2 is electrically connected to the first electrode of the driving transistor T1, a second electrode of the data writing transistor T2 is configured to be electrically connected to the data line VD so as to receive a data signal, and a gate electrode of the data writing transistor T2 is configured to be electrically connected to a third scanning line GA3 so as to receive a signal.

A first electrode of the storage capacitor CST is electrically connected to a first power end VDD, and a second electrode of the storage capacitor CST is electrically connected to the gate electrode of the driving transistor T1.

A first electrode of the threshold compensation transistor T3 is electrically connected to the second electrode of the driving transistor T1, a second electrode of the threshold compensation transistor T3 is electrically connected to a first electrode of the voltage stabilizing transistor T8, and a gate electrode of the threshold compensation transistor T3 is configured to be electrically connected to a third scanning line GA3 so as to receive a signal.

A first electrode of the initialization transistor T6 is configured to be electrically connected to the initialization line VINIT so as to receive a reset signal, a second electrode of the initialization transistor T6 is electrically connected to the first electrode of the voltage stabilizing transistor T8, and a gate electrode of the initialization transistor T6 is configured to be electrically connected to a first scanning line GA1 so as to receive a signal.

A first electrode of the second reset transistor T7 is configured to be electrically connected to the initialization line VINIT so as to receive a reset signal, a second electrode of the second reset transistor T7 is electrically connected to the first electrode of the light emitting device 0120, and a gate electrode of the second reset transistor T7 is configured to be electrically connected to a fourth scanning line GA4 so as to receive a signal.

A first electrode of the first light emitting control transistor T4 is electrically connected to the first power end VDD, a second electrode of the first light emitting control transistor T4 is electrically connected to the first electrode of the driving transistor T1, and a gate electrode of the first light emitting control transistor T4 is configured to be electrically connected to a light emitting control line EM so as to receive a light emitting control signal.

A first electrode of the second light emitting control transistor T5 is electrically connected to the second electrode of the driving transistor T1, a second electrode of the second light emitting control transistor T5 is electrically connected to the first electrode of the light emitting device 0120, and a gate electrode of the second light emitting control transistor T5 is configured to be electrically connected to the light emitting control line EM so as to receive a light emitting control signal.

A second electrode of the voltage stabilizing transistor T8 is electrically connected to the gate electrode of the driving transistor T1, and a gate electrode of the voltage stabilizing transistor T8 is configured to be electrically connected to the first scanning line GA2 so as to receive a signal.

The second electrode of the light emitting device 0120 is electrically connected to a second power end VSS. The first electrodes and the second electrodes of the above-mentioned transistors may be determined as source electrodes or drain electrodes according to actual application, which is not limited herein.

Exemplarily, one of the first power end VDD and the second power end VSS is a high-voltage end, and the other one is a low-voltage end. For example, in embodiments as shown in FIG. 2A, the first power end VDD is a voltage source so as to output a constant first voltage which is a positive voltage; and the second power end VSS may be a voltage source so as to output a constant second voltage which is a negative voltage. For example, in some examples, the second power end VSS may be grounded.

Figure 2B:
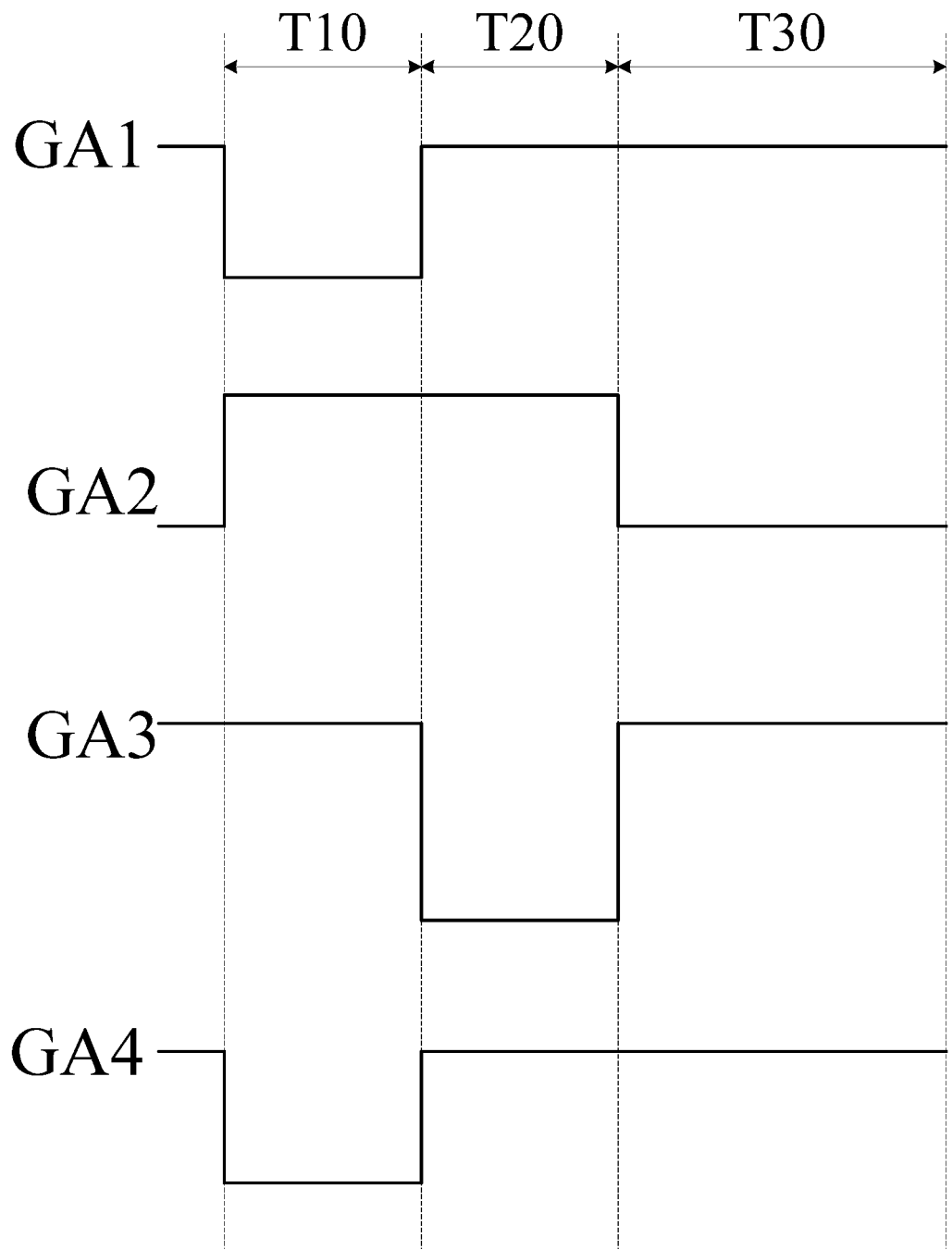
FIG. 2B is a timing diagram of signals provided by embodiments of the disclosure.

A timing diagram of signals corresponding to the pixel driving circuit as shown in FIG. 2A is shown in FIG. 2b. Within one-frame display time, a working process of the pixel driving circuit is divided into three stages: stage T10, stage T20 and stage T30, ga1 represents a signal transmitted on a first scanning line GA1, ga2 represents a signal transmitted on a second scanning line GA2, ga3 represents a signal transmitted on a third scanning line GA3, ga4 represents a signal transmitted on a fourth scanning line GA4, and em represents a signal transmitted on a light emitting control line EM.

At stage T10, the signal ga1 controls the initialization transistor T6 to be turned on, and the signal ga2 controls the voltage stabilizing transistor T8 to be turned on, so that the signal transmitted on the initialization line VINIT may be provided to the gate electrode of the driving transistor T1 to reset the gate electrode of the driving transistor T1. The signal ga4 controls the second reset transistor T7 to be turned on, so that the signal transmitted on the initialization line VINIT may be provided to the first electrode of the light emitting device 0120 to reset the first electrode of the light emitting device 0120. Moreover, at this stage, the signal ga3 controls both the data writing transistor T2 and the threshold compensation transistor T3 to be turned off. The signal em controls both the first light emitting control transistor T4 and the second light emitting control transistor T5 to be turned off.

At stage T20, the signal ga3 controls both the data writing transistor T2 and the threshold compensation transistor T3 to be turned on. Moreover, the signal ga2 controls the voltage stabilizing transistor T8 to be turned on, so that the data signal transmitted on the data line VD may charge the gate electrode of the driving transistor T1 to change a voltage of the gate electrode of the driving transistor T1 to be Vdata+ Vth, Vth represents a threshold voltage of the driving transistor T1, and Vdata represents a voltage of the data signal. Moreover, at this stage, the signal ga1 controls the initialization transistor T6 to be turned off, and the signal ga4 controls the second reset transistor T7 to be turned off. The signal em controls both the first light emitting control transistor T4 and the second light emitting control transistor T5 to be turned off.

At stage T30, the signal em controls both the first light emitting control transistor T4 and the second light emitting control transistor T5 to be turned on. The turned-on first light emitting control transistor T4 provides a voltage $V_{vdd}$ of the first power end VDD to the first electrode of the driving transistor T1, so that a voltage of the first electrode of the driving transistor T1 is $V_{vdd}$. The driving transistor T1 generates a driving current according to the voltage Vdata+ Vth of the gate electrode and the voltage $V_{vdd}$ of the first electrode of the driving transistor T1. The driving current is provided to the light emitting device 0120 by the turned-on second light emitting control transistor T5 so as to drive the light emitting device 0120 to emit light. Moreover, at this stage, the signal ga1 controls the initialization transistor T6 to be turned off, and the signal ga4 controls the second reset transistor T7 to be turned off. The signal ga3 controls both the data writing transistor T2 and the threshold compensation transistor T3 to be turned off. The signal ga2 controls the voltage stabilizing transistor T8 to be turned off.

Figure 2C:
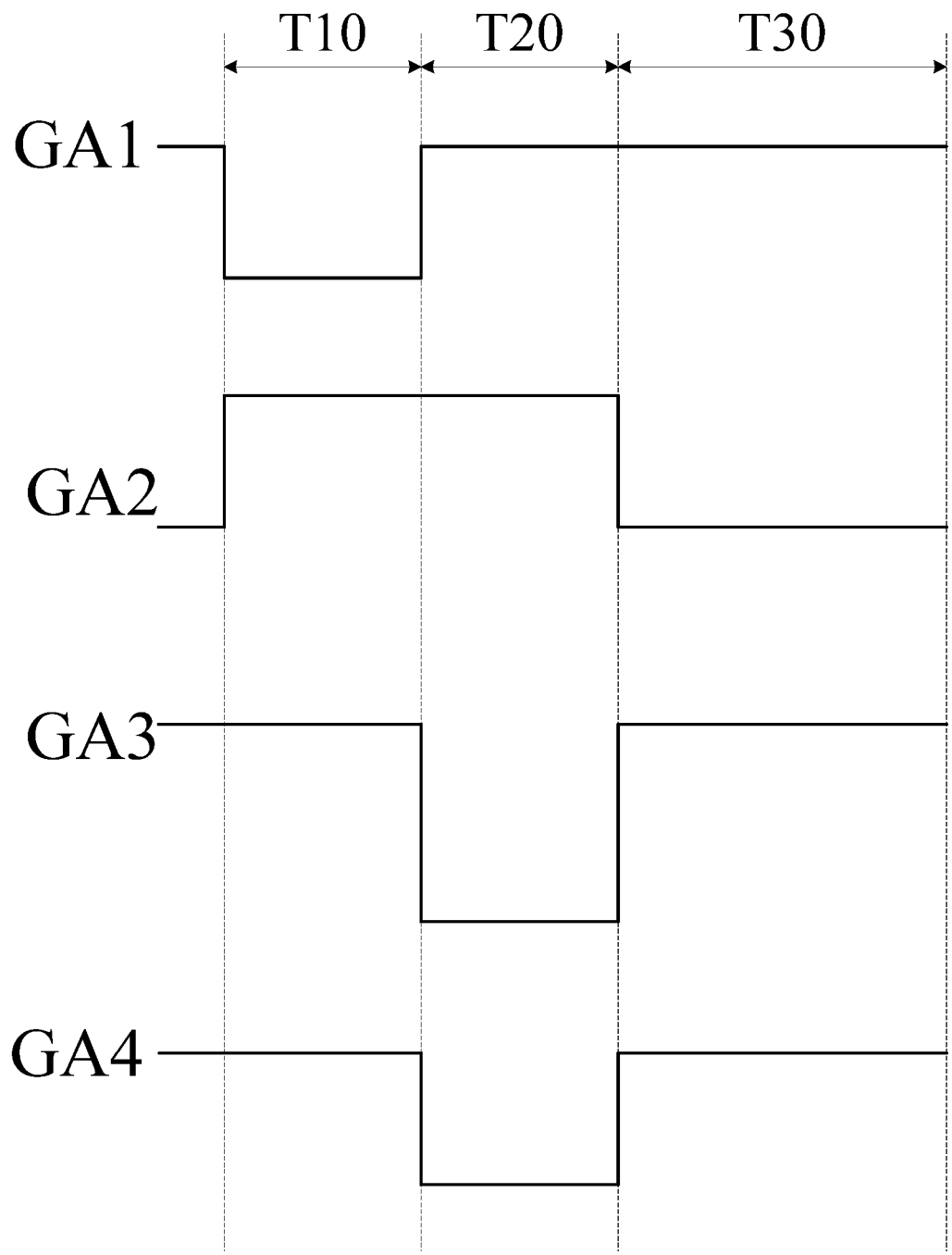
FIG. 2C is another timing diagram of signals provided by embodiments of the disclosure.

In some examples, another timing diagram of signals corresponding to the pixel driving circuit as shown in FIG. 2A is shown in FIG. 2C. Within one-frame display time, a working process of the pixel driving circuit is divided into three stages: stage T10, stage T20 and stage T30, ga1 represents a signal transmitted on a first scanning line GA1, ga2 represents a signal transmitted on a second scanning line GA2, ga3 represents a signal transmitted on a third scanning line GA3, ga4 represents a signal transmitted on a fourth scanning line GA4, and em represents a signal transmitted on a light emitting control line EM.

At stage T10, the signal ga4 controls the second reset transistor T7 to be turned off, the rest working process may refer to the above-mentioned embodiment, which is not described in detail herein.

At stage T20, the signal ga4 controls the second reset transistor T7 to be turned on, so that the signal transmitted on the initialization line VINIT may be provided to the first electrode of the light emitting device 0120 to reset the first electrode of the light emitting device 0120.

The rest working process may refer to the above-mentioned embodiment, which is not described in detail herein.

At stage T30, the working process at this stage may refer to the above-mentioned embodiment, which is not described in detail herein.

Figure 2D:
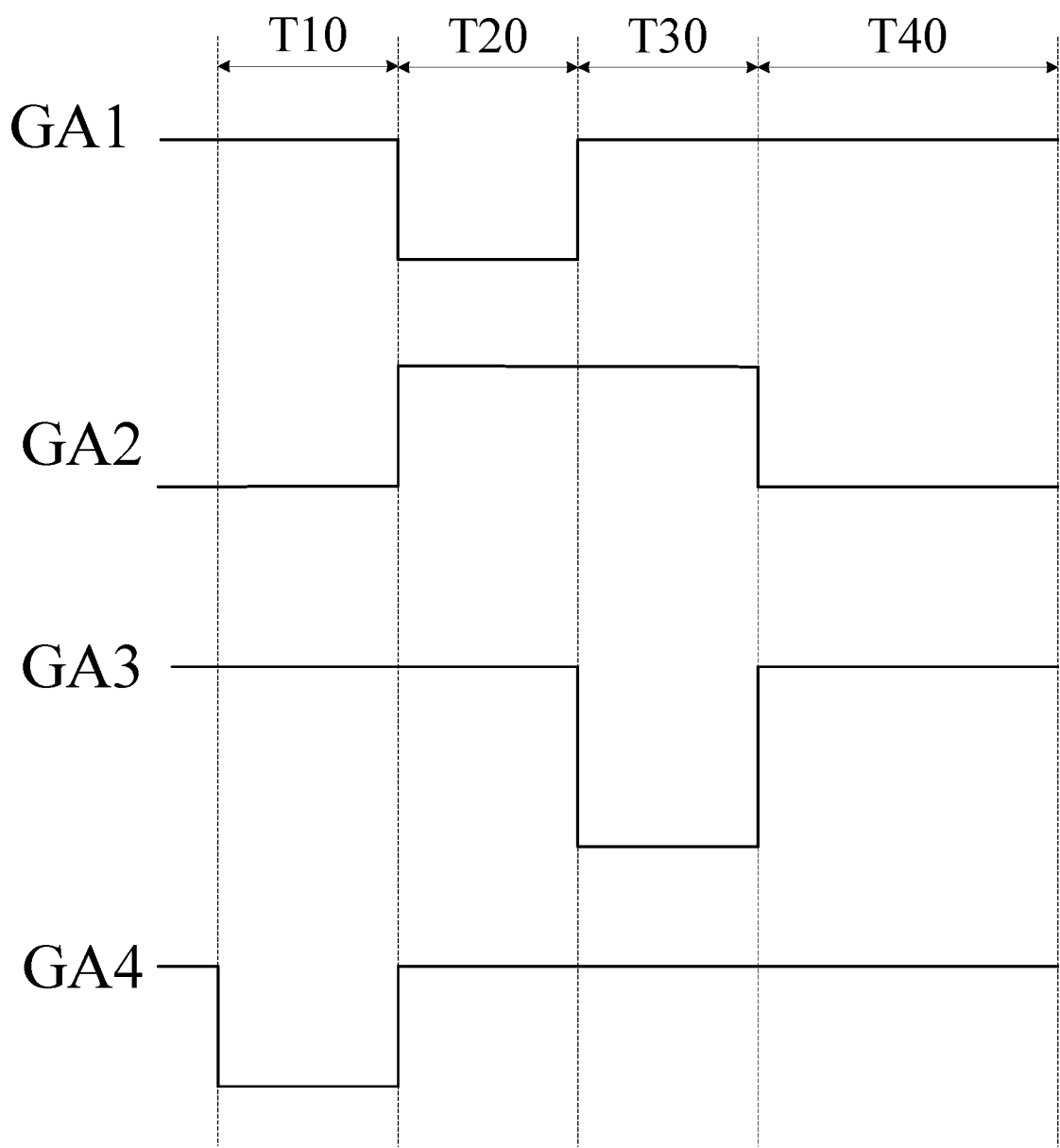
FIG. 2D is a further timing diagram of signals provided by embodiments of the disclosure.

In some examples, a further timing diagram of signals corresponding to the pixel driving circuit as shown in FIG. 2A is shown in FIG. 2D. Within one-frame display time, a working process of the pixel driving circuit is divided into four stages: stage T10, stage T20, stage T30 and stage T40, ga1 represents a signal transmitted on a first scanning line GA1, ga2 represents a signal transmitted on a second scanning line GA2, ga3 represents a signal transmitted on a third scanning line GA3, ga4 represents a signal transmitted on a fourth scanning line GA4, and em represents a signal transmitted on a light emitting control line EM.

At stage T10, the signal ga4 controls the second reset transistor T7 to be turned on, so that the signal transmitted on the initialization line VINIT is provided to the first electrode of the light emitting device 0120 to reset the first electrode of the light emitting device 0120. Moreover, at this stage, the signal ga1 controls the initialization transistor T6 to be turned off, and the signal ga3 controls both the data writing transistor T2 and the threshold compensation transistor T3 to be turned off. The signal em controls both the first light emitting control transistor T4 and the second light emitting control transistor T5 to be turned off. The signal ga2 controls the voltage stabilizing transistor T8 to be turned off.

At stage T20, the signal ga1 controls the initialization transistor T6 to be turned on, and the signal ga2 controls the voltage stabilizing transistor T8 to be turned on, so that the signal transmitted on the initialization line VINIT may be provided to the gate electrode of the driving transistor T1 to reset the gate electrode of the driving transistor T1. Moreover, at this stage, the signal ga4 controls the second reset transistor T7 to be turned off, and the signal ga3 controls both the data writing transistor T2 and the threshold compensation transistor T3 to be turned off. The signal em controls both the first light emitting control transistor T4 and the second light emitting control transistor T5 to be turned off.

At stage T30, the signal ga3 controls both the data writing transistor T2 and the threshold compensation transistor T3 to be turned on. Moreover, the signal ga2 controls the voltage stabilizing transistor T8 to be turned on, so that the data signal transmitted on the data line VD may charge the gate electrode of the driving transistor T1 to change a voltage of the gate electrode of the driving transistor T1 to be Vdata+Vth, Vth represents a threshold voltage of the driving transistor T1, and Vdata represents a voltage of the data signal. Moreover, at this stage, the signal ga1 controls the initialization transistor T6 to be turned off, and the signal ga4 controls the second reset transistor T7 to be turned off. The signal em controls both the first light emitting control transistor T4 and the second light emitting control transistor T5 to be turned off.

At stage T40, the signal em controls both the first light emitting control transistor T4 and the second light emitting control transistor T5 to be turned on. The turned-on first light emitting control transistor T4 provides a voltage $V_{vdd}$ of the first power end VDD to the first electrode of the driving transistor T1, so that a voltage of the first electrode of the driving transistor T1 is $V_{vdd}$. The driving transistor T1 generates a driving current according to the voltage Vdata+Vth of the gate electrode and the voltage $V_{vdd}$ of the first electrode of the driving transistor T1. The driving current is provided to the light emitting device 0120 by the turned-on second light emitting control transistor T5 so as to drive the light emitting device 0120 to emit light. Moreover, at this stage, the signal ga1 controls the initialization transistor T6 to be turned off, and the signal ga4 controls the second reset transistor T7 to be turned off. The signal ga3 controls both the data writing transistor T2 and the threshold compensation transistor T3 to be turned off. The signal ga2 controls the voltage stabilizing transistor T8 to be turned off.

Figure 2E:
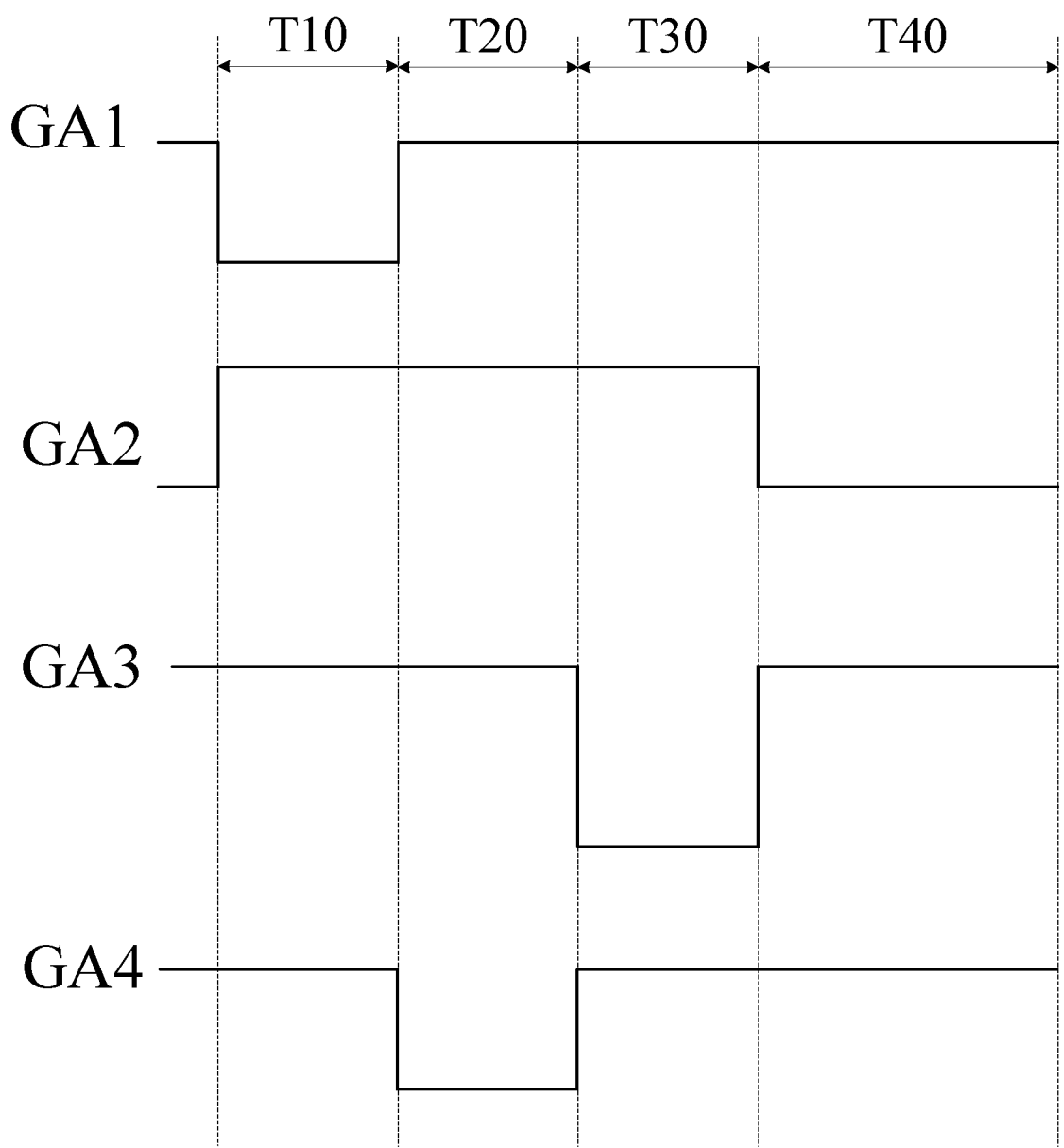
FIG. 2E is a yet further timing diagram of signals provided by embodiments of the disclosure.

In some examples, a yet further timing diagram of signals corresponding to the pixel driving circuit as shown in FIG. 2A is shown in FIG. 2E. Within one-frame display time, a working process of the pixel driving circuit is divided into four stages: stage T10, stage T20, stage T30 and stage T40, ga1 represents a signal transmitted on a first scanning line GA1, ga2 represents a signal transmitted on a second scanning line GA2, ga3 represents a signal transmitted on a third scanning line GA3, ga4 represents a signal transmitted on a fourth scanning line GA4, and em represents a signal transmitted on a light emitting control line EM.

At stage T10, the signal ga1 controls the initialization transistor T6 to be turned on, and the signal ga2 controls the voltage stabilizing transistor T8 to be turned on, so that the signal transmitted on the initialization line VINIT may be provided to the gate electrode of the driving transistor T1 to reset the gate electrode of the driving transistor T1. Moreover, at this stage, the signal ga4 controls the second reset transistor T7 to be turned off, and the signal ga3 controls both the data writing transistor T2 and the threshold compensation transistor T3 to be turned off. The signal em controls both the first light emitting control transistor T4 and the second light emitting control transistor T5 to be turned off.

At stage T20, the signal ga4 controls the second reset transistor T7 to be turned on, so that the signal transmitted on the initialization line VINIT may be provided to the first electrode of the light emitting device 0120 to reset the first electrode of the light emitting device 0120. Moreover, at this stage, the signal ga1 controls the initialization transistor T6 to be turned off, and the signal ga3 controls both the data writing transistor T2 and the threshold compensation transistor T3 to be turned off. The signal em controls both the first light emitting control transistor T4 and the second light emitting control transistor T5 to be turned off.

At stage T30, the signal ga3 controls both the data writing transistor T2 and the threshold compensation transistor T3 to be turned on. Moreover, the signal ga2 controls the voltage stabilizing transistor T8 to be turned on, so that the data signal transmitted on the data line VD may charge the gate electrode of the driving transistor T1 to change a voltage of the gate electrode of the driving transistor T1 to be Vdata+Vth, Vth represents a threshold voltage of the driving transistor T1, and Vdata represents a voltage of the data signal. Moreover, at this stage, the signal ga1 controls the initialization transistor T6 to be turned off, and the signal ga4 controls the second reset transistor T7 to be turned off. The signal em controls both the first light emitting control transistor T4 and the second light emitting control transistor T5 to be turned off.

At stage T40, the signal em controls both the first light emitting control transistor T4 and the second light emitting control transistor T5 to be turned on. The turned-on first light emitting control transistor T4 provides a voltage $V_{vdd}$ of the first power end VDD to the first electrode of the driving transistor T1, so that a voltage of the first electrode of the driving transistor T1 is $V_{vdd}$. The driving transistor T1 generates a driving current according to the voltage Vdata+ Vth of the gate electrode and the voltage $V_{vdd}$ of the first electrode of the driving transistor T1. The driving current is provided to the light emitting device 0120 by the turned-on second light emitting control transistor T5 so as to drive the light emitting device 0120 to emit light. Moreover, at this stage, the signal ga1 controls the initialization transistor T6 to be turned off, and the signal ga4 controls the second reset transistor T7 to be turned off. The signal ga3 controls both the data writing transistor T2 and the threshold compensation transistor T3 to be turned off. The signal ga2 controls the voltage stabilizing transistor T8 to be turned off.

It should be noted that, in embodiments of the disclosure, the pixel driving circuit in the sub-pixel may also be of a structure including another number of transistors in addition to the structure as shown in FIG. 2A, which is not limited herein.

Figure 3:
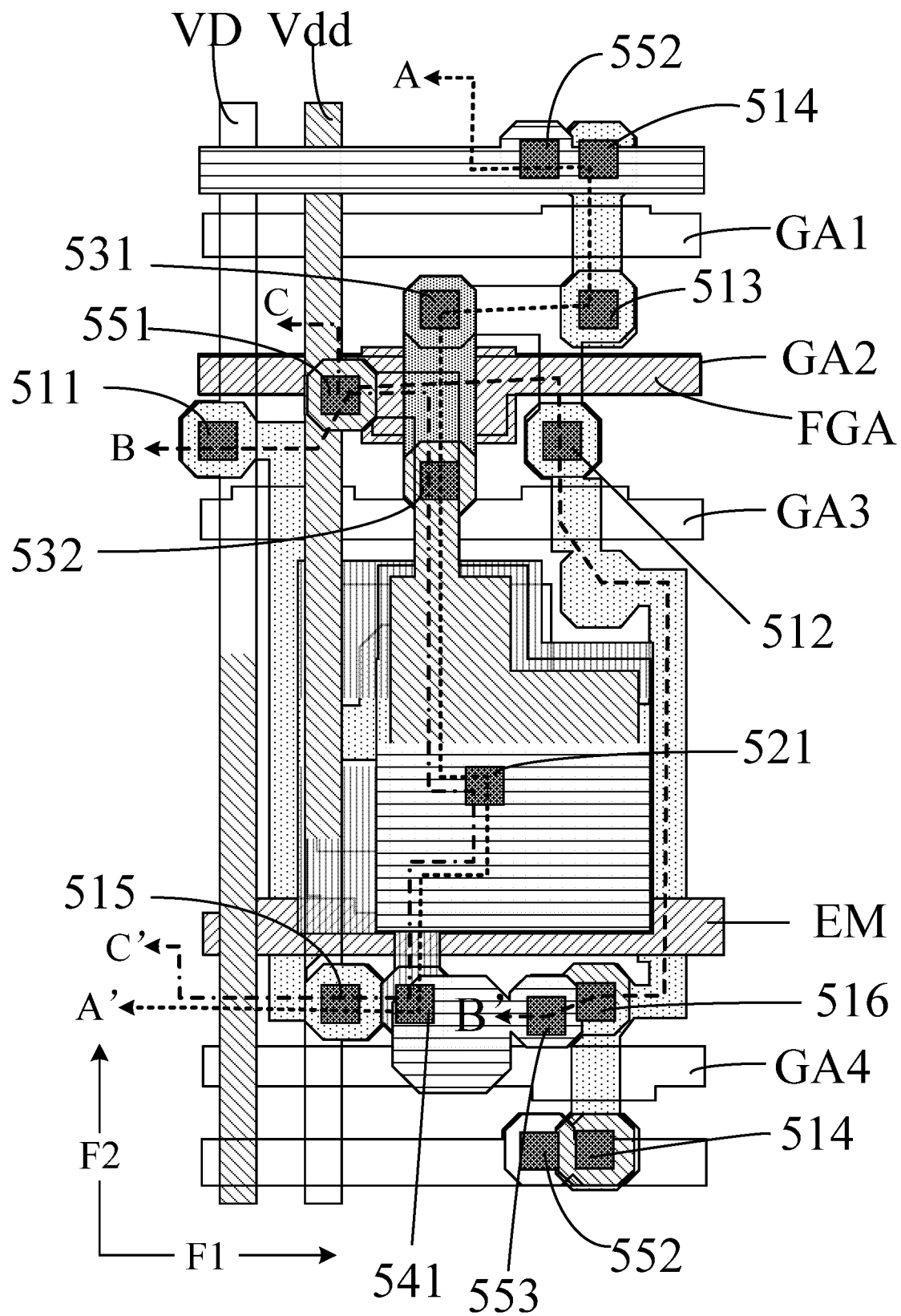
FIG. 3 is a schematic structural diagram showing layout of a pixel driving circuit provided by embodiments of the disclosure.

FIG. 3 is a schematic structural diagram showing layout of a pixel driving circuit provided by embodiments of the disclosure. FIG. 4A to FIG. 4F are schematic diagrams of each layer of the pixel driving circuit provided by embodiments of the disclosure. Examples shown in FIG. 3 to FIG. 4F are described with a pixel driving circuit of one sub-pixel spx as an example. FIG. 3 to FIG. 4F further show a first scanning line GA1, a second scanning line GA2, a third scanning line GA3, a fourth scanning line GA4, an initialization line VINIT, a light emitting control line EM, a data line VD and a power line Vdd which are electrically connected to a pixel driving circuit 0121. The power line Vdd is configured to input a driving voltage (that is, a first voltage) to the first power end VDD. Exemplarily, a plurality of data lines VD may be arranged in a first direction F1.

Figure 4A:
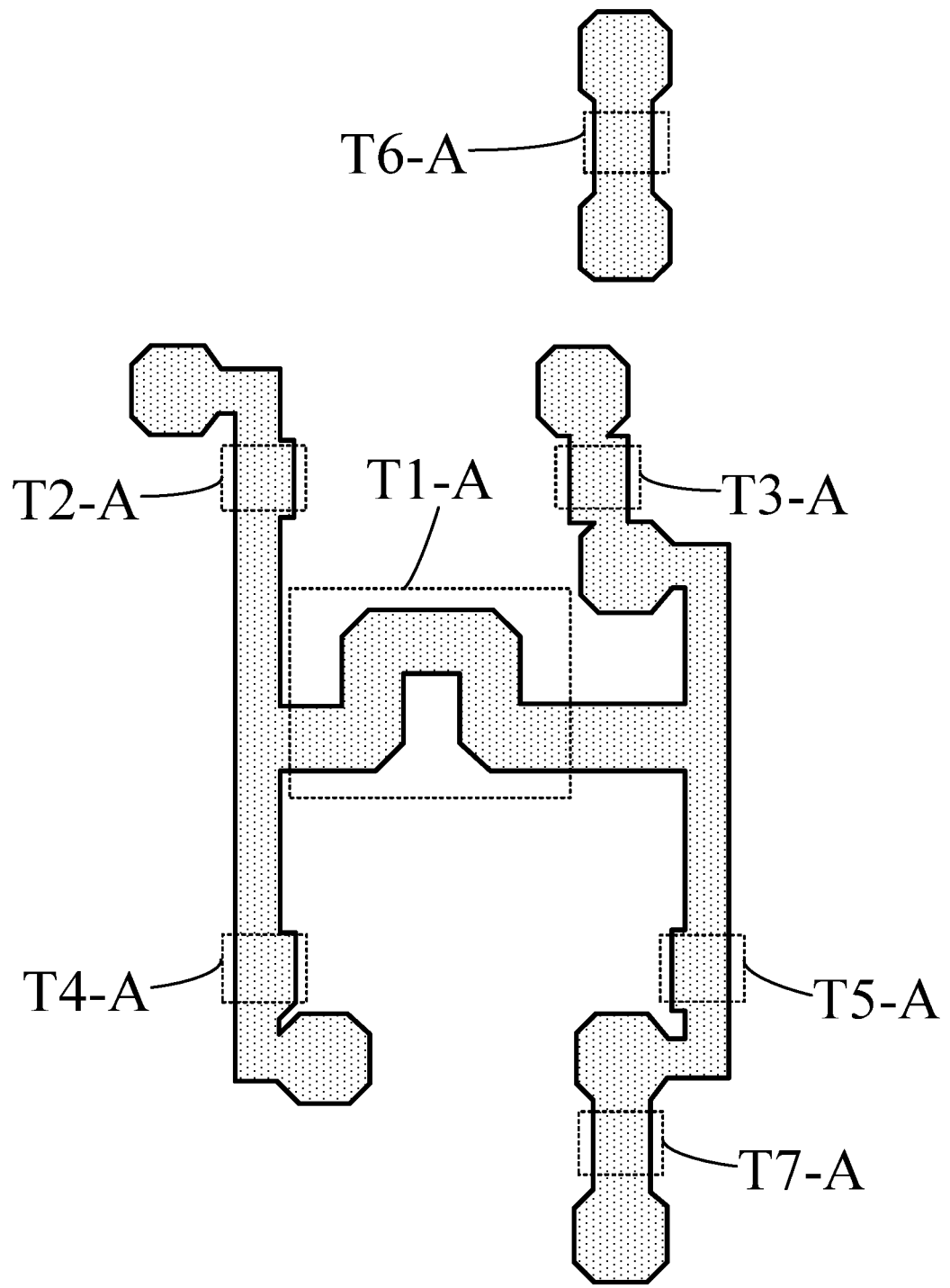
FIG. 4A is a schematic structural diagram of a silicon semiconductor layer provided by embodiments of the disclosure.

Exemplarily, as shown in FIG. 3, FIG. 4A, and FIG. 5A to FIG. 6, a silicon semiconductor layer 500 of the pixel driving circuit 0121 is shown. The silicon semiconductor layer 500 may be formed by patterning an amorphous silicon material or an LTPS (Low Temperature Poly-Silicon) material. The silicon semiconductor layer 500 may be used for manufacturing active silicon layers of the driving transistor T1, the data writing transistor T2, the threshold compensation transistor T3, the first light emitting control transistor T4, the second light emitting control transistor T5, the initialization transistor T6 and the second reset transistor T7. Moreover, each of the active silicon layers may include a first region, a second region and a first channel region between the first region and the second region. For example, FIG. 4A shows a first channel region T1-A of the driving transistor T1, a first channel region T2-A of the data writing transistor T2, a first channel region T3-A of the threshold compensation transistor T3, a first channel region T4-A of the first light emitting control transistor T4, a first channel region T5-A of the second light emitting control transistor T5, a first channel region T6-A of the initialization transistor T6 and a first channel region T7-A of the second reset transistor T7. It should be noted that each of the above-mentioned first region and second region may be a conductor region formed by a region, in which n-type impurities or p-type impurities are doped, in the silicon semiconductor layer 500. Therefore, the first region and the second region may be used as a source electrode region and a drain electrode region of the active silicon layer for performing an electrical connection.

Exemplarily, as shown in FIG. 3 and FIG. 4A, the active silicon layer of the initialization transistor T6 may extend approximately in a straight line in a second direction F2. For example, an extension direction of the active silicon layer of the initialization transistor T6 is approximately parallel to the second direction F2. It should be noted that, in an actual process, due to restrictions of process conditions or other factors, the extension direction of the active silicon layer of the initialization transistor T6 may not be completely parallel to the second direction, it is possible to generate some deviations, and therefore, as long as the above-mentioned extension direction of the active silicon layer of the initialization transistor T6 and the second direction shall approximately meet parallel conditions, it shall fall within the protective scope of the disclosure. For example, the above-mentioned parallel may be allowed within an error allowable range.

Exemplarily, as shown in FIG. 3 and FIG. 4A, the active silicon layer of the threshold compensation transistor T3 may extend approximately in a straight line in the second direction F2. For example, an extension direction of the active silicon layer of the threshold compensation transistor T3 is approximately parallel to the second direction F2. It should be noted that, in an actual process, due to restrictions of process conditions or other factors, the extension direction of the active silicon layer of the threshold compensation transistor T3 may not be completely parallel to the second direction, it is possible to generate some deviations, and therefore, as long as the above-mentioned extension direction of the active silicon layer of the threshold compensation transistor T3 and the second direction approximately meet parallel conditions, it shall fall within the protective scope of the disclosure. For example, the above-mentioned parallel may be allowed within an error allowable range.

Figure 4B:
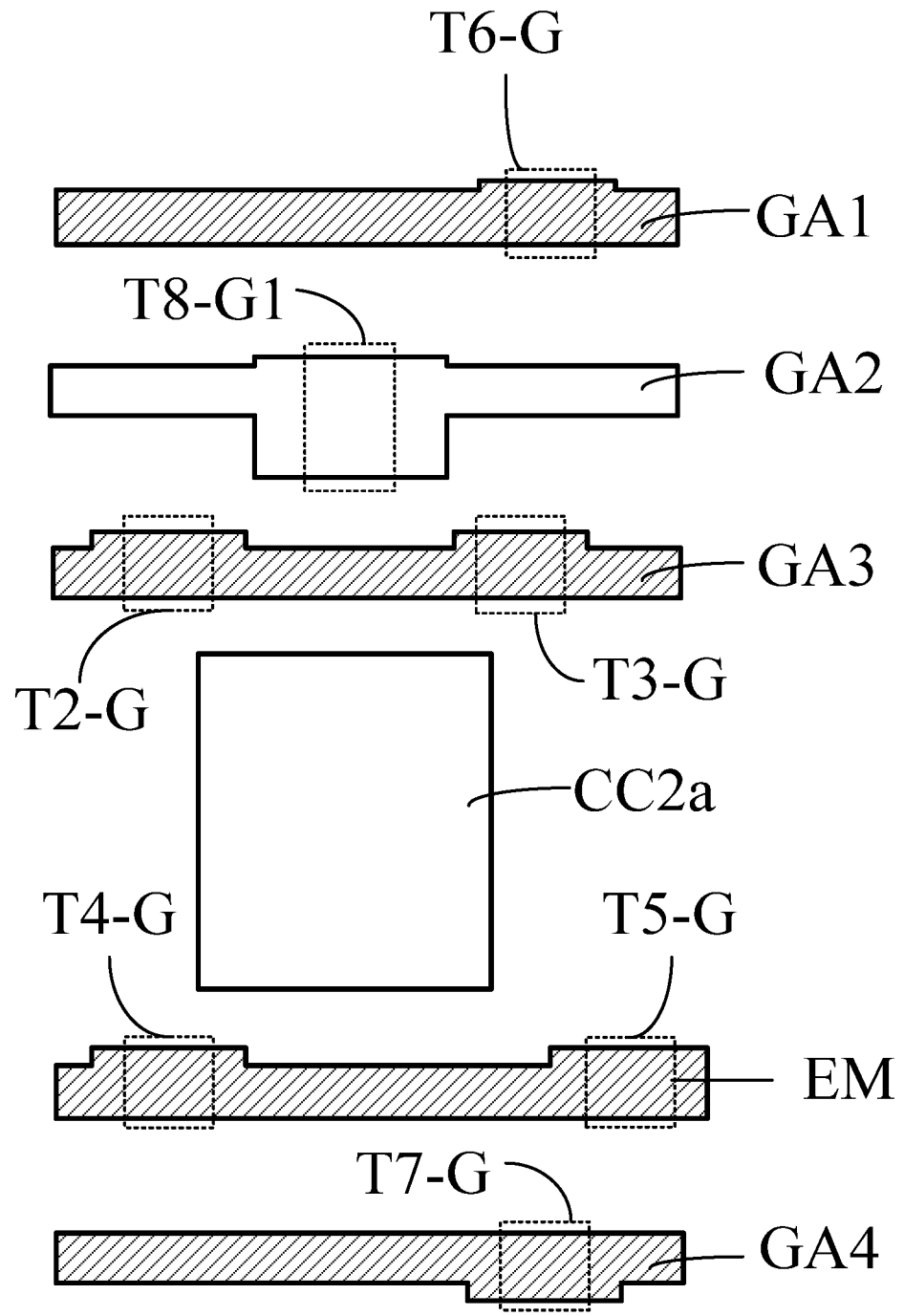
FIG. 4B is a schematic structural diagram of a first conducting layer provided by embodiments of the disclosure.
Figure 5A:
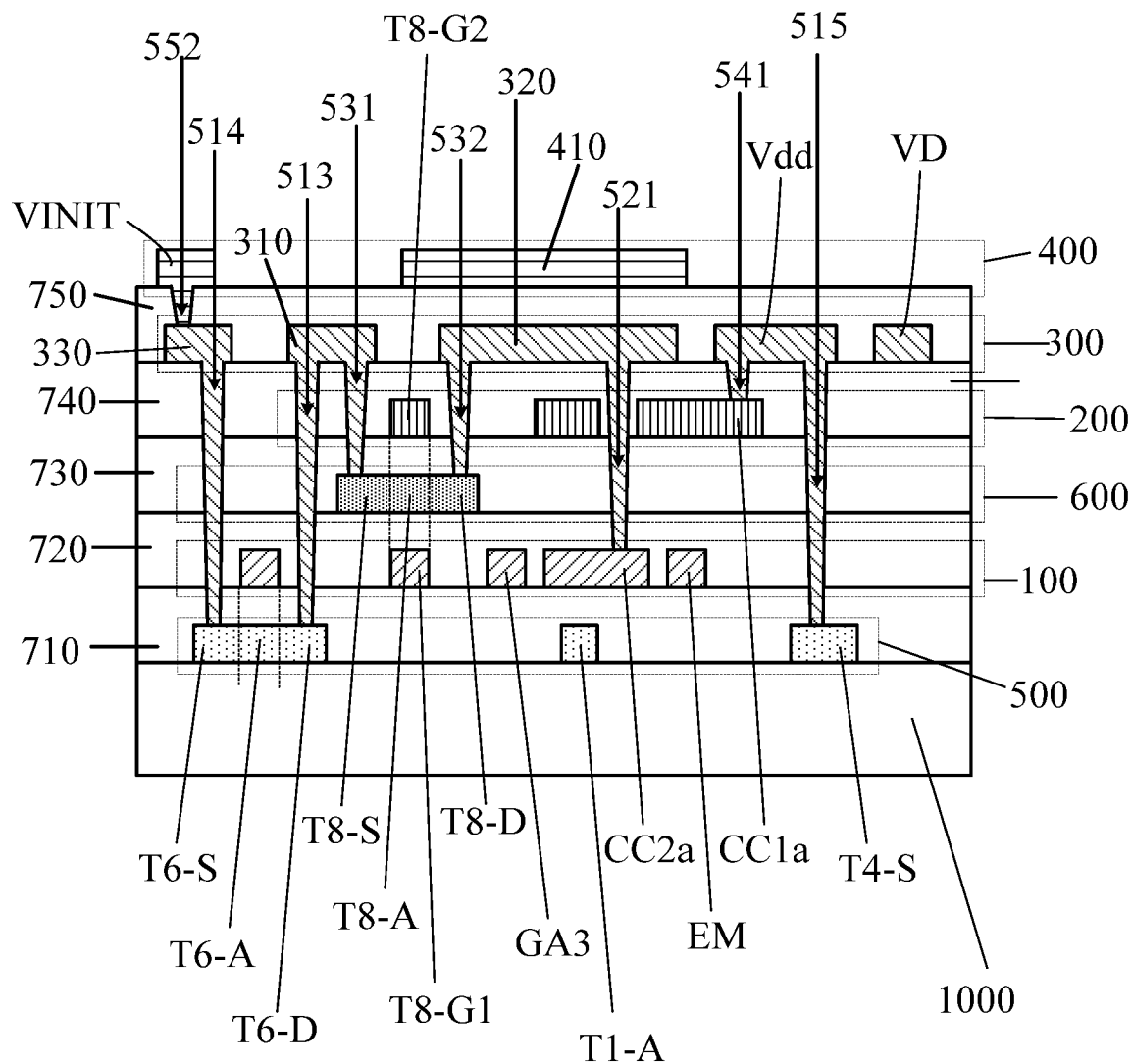
FIG. 5A is a section view in AA' direction in the schematic structural diagram showing the layout of the pixel driving circuit in FIG. 3.
Figure 5B:
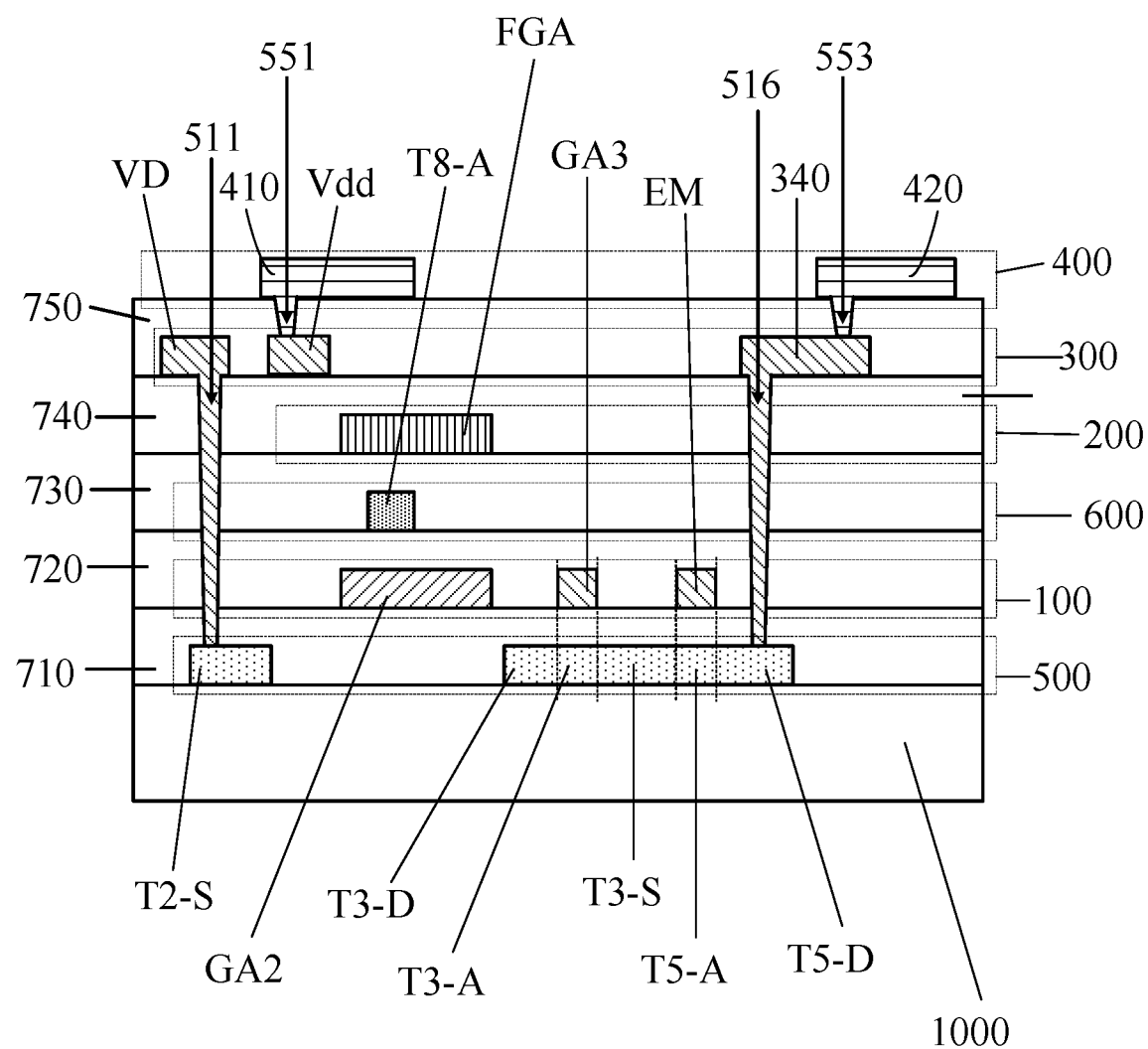
FIG. 5B is a section view in BB' direction in the schematic structural diagram showing the layout of the pixel driving circuit in FIG. 3.

Exemplarily, as shown in FIG. 5A and FIG. 5B, a first insulating layer 710 is formed on the above-mentioned silicon semiconductor layer 500 and is used for protecting the above-mentioned silicon semiconductor layer 500. As shown in FIG. 3, FIG. 4B, FIG. 5A to FIG. 6, a first conducting layer 100 of the pixel driving circuit 0121 is shown. The first conducting layer 100 is arranged at a side, facing away from the base substrate 1000, of the first insulating layer 710, thereby being insulated from the silicon semiconductor layer 500. The first conducting layer 100 may include a plurality of scanning lines spaced from one another, a plurality of light emitting control lines EM spaced from one another as well as a gate electrode CC2a of the driving transistor T1, a gate electrode T2-G of the data writing transistor T2, a gate electrode T3-G of the threshold compensation transistor T3, a gate electrode T4-G of the first light emitting control transistor T4, a gate electrode T5-G of the second light emitting control transistor T5, a gate electrode T6-G of the initialization transistor T6, a gate electrode T7-G of the second reset transistor T7 and a first gate electrode T8-G1 of the voltage stabilizing transistor T8. Exemplarily, the plurality of scanning lines may include, for example, a plurality of first scanning lines GA1, a plurality of second scanning lines GA2, a plurality of third scanning lines GA3 and a plurality of fourth scanning lines GA4 spaced from one another. Exemplarily, a row of sub-pixels corresponds to one of the first scanning lines GA1, one of the second scanning lines GA2, one of the third scanning lines GA3, one of the fourth scanning lines GA4 and one of the light emitting control lines EM.

For example, as shown in FIG. 3 to FIG. 4B, the gate electrode T2-G of the data writing transistor T2 may be a first part, overlapped with the silicon semiconductor layer 500, of the third scanning line GA3. An orthographic projection of the third scanning line GA3 on the base substrate 1000 is overlapped with an orthographic projection of the first channel region T3-A of the active silicon layer of the threshold compensation transistor T3 on the base substrate 1000 to form a third overlapping region, and a part, in the third overlapping region, of the third scanning line GA3 is the gate electrode T3-G of the threshold compensation transistor T3, that is, the gate electrode T3-G of the threshold compensation transistor T3 may be a second part, overlapped with the silicon semiconductor layer 500, of the third scanning line GA3. An orthographic projection of the light emitting control line EM on the base substrate 1000 is overlapped with the first channel region T4-A of the active silicon layer of the first light emitting control transistor T4 to form a fourth overlapping region, and a part, in the fourth overlapping region, of the light emitting control line EM is the gate electrode T4-G of the first light emitting control transistor T4, that is, the gate electrode T4-G of the first light emitting control transistor T4 may be a first part, overlapped with the silicon semiconductor layer 500, of the light emitting control line EM. An orthographic projection of the light emitting control line EM on the base substrate 1000 is overlapped with the first channel region T5-A of the active silicon layer of the second light emitting control transistor T5 to form a fifth overlapping region, and a part, in the fifth overlapping region, of the light emitting control line EM is the gate electrode T5-G of the second light emitting control transistor T5, that is, the gate electrode T5-G of the second light emitting control transistor T5 may be a second part, overlapped with the silicon semiconductor layer 500, of the light emitting control line EM.

Moreover, an orthographic projection of the first scanning line GA1 on the base substrate 1000 is overlapped with an orthographic projection of the first channel region T6-A of the active silicon layer of the initialization transistor T6 on the base substrate 1000 to form a first overlapping region, and a part, in the first overlapping region, of the first scanning line GA1 is the gate electrode T6-G of the initialization transistor T6, that is, the gate electrode T6-G of the initialization transistor T6 may be a first part, overlapped with the silicon semiconductor layer 500, of the first scanning line GA1, and the gate electrode T7-G of the second reset transistor T7 may be a first part, overlapped with the silicon semiconductor layer 500, of the fourth scanning line GA4. The first gate electrode T8-G1 of the voltage stabilizing transistor T8 may be a first part, overlapped with the silicon semiconductor layer 500, of the second scanning line GA2. Moreover, the gate electrode CC2a of the driving transistor T1 may be set as an electrode plate of the storage capacitor CST. In other words, the gate electrode CC2a of the driving transistor T1 and one electrode plate of the storage capacitor CST are of an integrated structure. Moreover, an orthographic projection of the second scanning line GA2 on the base substrate 1000 is overlapped with an orthographic projection of the second channel region T8-A of an active oxide layer of the voltage stabilizing transistor T8 on the base substrate 1000 to form a second overlapping region, and a part, in the second overlapping region, of the second scanning line GA2 is the first gate electrode T8-G1 of the voltage stabilizing transistor T8.

Exemplarily, as shown in FIG. 3 and FIG. 4B, the first scanning line GA1, the second scanning line GA2, the third scanning line GA3, the light emitting control line EM and the fourth scanning line GA4 extend in the first direction F1. Moreover, the first scanning line GA1, the second scanning line GA2, the third scanning line GA3, the light emitting control line EM and the fourth scanning line GA4 are arranged in the second direction F2. In the same sub-pixel, the orthographic projection of the second scanning line GA2 on the base substrate 1000 is located between the orthographic projection of the first scanning line GA1 on the base substrate 1000 and the orthographic projection of the third scanning line GA3 on the base substrate 1000. The orthographic projection of the third scanning line GA3 on the base substrate 1000 is located between the orthographic projection of the second scanning line GA2 on the base substrate 1000 and the orthographic projection of the light emitting control line EM on the base substrate 1000. An orthographic projection of the fourth scanning line GA4 on the base substrate 1000 is at a side, facing away from the orthographic projection of the third scanning line GA3 on the base substrate 1000, of the orthographic projection of the light emitting control line EM on the base substrate 1000. Moreover, in the same sub-pixel, an orthographic projection of the active oxide layer of the voltage stabilizing transistor T8 on the base substrate 1000 is located between the orthographic projection of the first scanning line GA1 on the base substrate 1000 and the orthographic projection of the third scanning line GA3 on the base substrate 1000, and the orthographic projection of the second scanning line GA2 on the base substrate 1000 is respectively not overlapped with an orthographic projection of the active silicon layer of the threshold compensation transistor T3 on the base substrate 1000 and an orthographic projection of the active silicon layer of the initialization transistor T6 on the base substrate 1000. Of course, it is possible that the orthographic projection of the second scanning line GA2 on the base substrate 1000 is partially overlapped with an orthographic projection of the first region of the active silicon layer of the threshold compensation transistor T3 on the base substrate 1000. Or, the orthographic projection of the second scanning line GA2 on the base substrate 1000 may also partially overlapped with an orthographic projection of the second region of the active silicon layer of the initialization transistor T6 on the base substrate 1000. Of course, these setting ways may be designed and determined according to a demand of actual application, which is not limited herein.

Exemplarily, as shown in FIG. 3 and FIG. 4B, in the same sub-pixel, an orthographic projection of the light emitting control line EM on the base substrate 1000 is at a side, facing away from the orthographic projection of the second scanning line GA2 on the base substrate 1000, of the orthographic projection of the third scanning line GA3 on the base substrate 1000. The orthographic projection of the fourth scanning line GA4 on the base substrate 1000 is at the side, facing away from the orthographic projection of the second scanning line GA2 on the base substrate 1000, of the orthographic projection of the light emitting control line EM on the base substrate 1000. Both orthographic projections of the active silicon layer and the gate electrode of the driving transistor T1 on the base substrate 1000 are between the orthographic projection of the light emitting control line EM on the base substrate 1000 and the orthographic projection of the third scanning line GA3 on the base substrate 1000.

Exemplarily, as shown in FIG. 3 and FIG. 4B, in the second direction F2, an orthographic projection of the gate electrode CC2a of the driving transistor T1 on the base substrate 1000 is between the orthographic projection of the third scanning line GA3 on the base substrate 1000 and the orthographic projection of the light emitting control line EM on the base substrate 1000. Moreover, in the second direction F2, the gate electrode T2-G of the data writing transistor T2, the gate electrode T3-G of the threshold compensation transistor T3, the gate electrode T6-G of the initialization transistor T6 and the first gate electrode T8-G1 of the voltage stabilizing transistor T8 are located at the side, facing away from the light emitting control line EM, of the gate electrode of the driving transistor T1, and the gate electrode T7-G of the second reset transistor T7, the gate electrode T4-G of the first light emitting control transistor T4 and the gate electrode T5-G of the second light emitting control transistor T5 are located at the side, facing away from the first scanning line GA1, of the gate electrode of the driving transistor T1.

For example, in some embodiments, as shown in FIG. 3 and FIG. 4B, in the first direction F1, both the gate electrode T2-G of the data writing transistor T2 and the gate electrode T4-G of the first light emitting control transistor T4 are located at a third side of the gate electrode of the driving transistor T1, and the gate electrode T3-G of the threshold compensation transistor T3, the gate electrode T5-G of the second light emitting control transistor T5, the gate electrode T6-G of the initialization transistor T6 and the gate electrode T7-G of the second reset transistor T7 are located at a fourth side of the gate electrode of the driving transistor T1. The third side and the fourth side of the gate electrode of the driving transistor T1 are two sides, opposite to each other in the first direction F1, of the gate electrode of the driving transistor T1. Moreover, the first gate electrode T8-G1 of the voltage stabilizing transistor T8 and the gate electrode of the driving transistor T1 are arranged, in the first direction F1, in a straight line. For example, the center of the first gate electrode T8-G1 of the voltage stabilizing transistor T8 and the center of the gate electrode of the driving transistor T1 are arranged, in the first direction F1, in a straight line.

Exemplarily, as shown in FIG. 5A and FIG. 5B, a second insulating layer 720 is formed on the above-mentioned first conducting layer 100 and is used for protecting the above-mentioned first conducting layer 100. In FIG. 3, FIG. 4C, FIG. 5A to FIG. 6, an oxide semiconductor layer 600 of the pixel driving circuit 0121 is shown. The oxide semiconductor layer 600 is arranged at a side, facing away from the base substrate 1000, of the second insulating layer 720. The oxide semiconductor layer 600 may be formed by patterning an oxide semiconductor material. Exemplarily, the oxide semiconductor material may be, for example, IGZO (Indium Gallium Zinc Oxide).

Figure 4C:
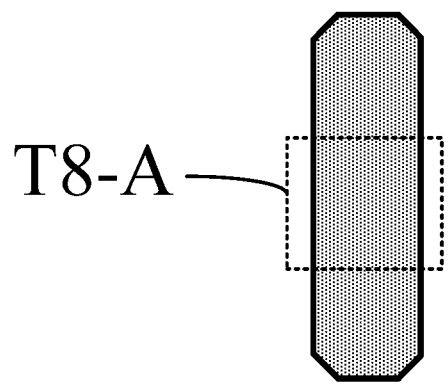
FIG. 4C is a schematic structural diagram of an oxide semiconductor layer provided by embodiments of the disclosure.
Figure 4D:
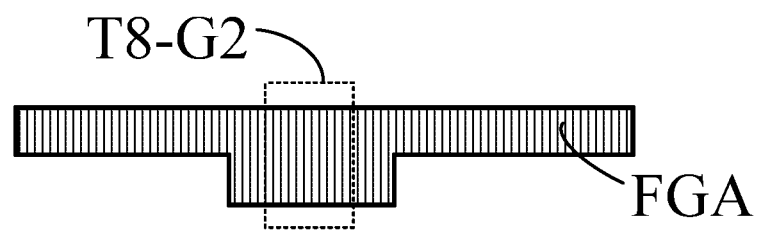
FIG. 4D is a schematic structural diagram of a second conducting layer provided by embodiments of the disclosure.
Figure 4D:
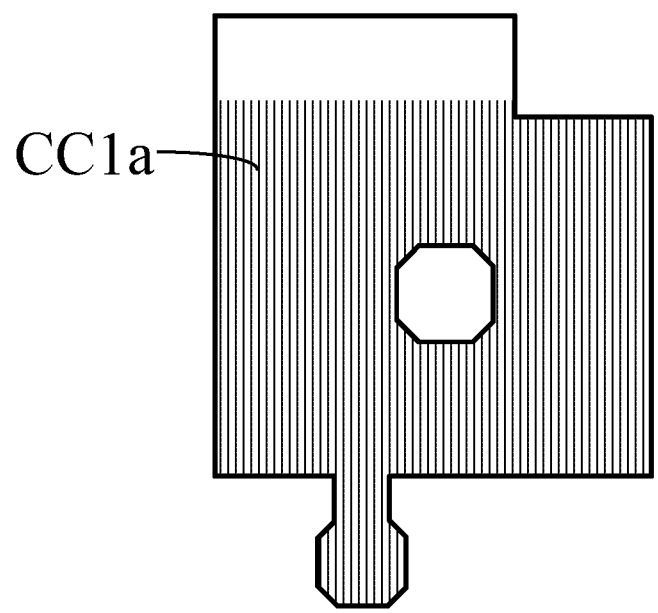

Moreover, the oxide semiconductor layer 600 may include the active oxide layer of the voltage stabilizing transistor T8. The active oxide layer is provided with a third region, a fourth region and a second channel region T8-A between the third region and the fourth region. For example, FIG. 4C shows the second channel region T8-A of the voltage stabilizing transistor T8. It should be noted that each of the third region and the fourth region may be a conductor region formed by a region, in which n-type impurities or p-type impurities are doped, in the oxide semiconductor layer 600. Therefore, the third region and the fourth region may be used as a source electrode region and a drain electrode region of the active oxide layer for performing an electrical connection.

Exemplarily, as shown in FIG. 3 and FIG. 4C, the active oxide layer of the voltage stabilizing transistor T8 extends approximately in a straight line in the second direction F2. For example, an extension direction of the active oxide layer of the voltage stabilizing transistor T8 is approximately parallel to the second direction F2. It should be noted that, in an actual process, due to restrictions of process conditions or other factors, the extension direction of the active oxide layer of the voltage stabilizing transistor T8 may not be completely parallel to the second direction, it is possible to generate some deviations, and therefore, as long as the extension direction of the active oxide layer of the above-mentioned voltage stabilizing transistor T8 and the second direction approximately meet parallel directions, it shall fall within the protective scope of the disclosure. For example, the above-mentioned parallel may be allowed within an error allowable range.

Exemplarily, as shown in FIG. 5A and FIG. 5B, a third insulating layer 730 is formed on the above-mentioned oxide semiconductor layer 600 and is used for protecting the above-mentioned oxide semiconductor layer 600. As shown in FIG. 3, FIG. 4D, FIG. 5A to FIG. 6, a second conducting layer 200 of the pixel driving circuit 0121 is shown. The second conducting layer 200 is arranged at a side, facing away from the base substrate 1000, of the third insulating layer 730. The second conducting layer 200 may include a plurality of auxiliary scanning lines FGA spaced from one another and a storage conducting part CC1a spaced from the auxiliary scanning lines FGA. Exemplarily, an orthographic projection of the storage conducting part CC1a on the base substrate 1000 is at least partially overlapped with the orthographic projection of the gate electrode CC2a of the driving transistor T1 on the base substrate 1000 to form a storage capacitor CST. Moreover, exemplarily, a row of sub-pixels corresponds to one of the auxiliary scanning lines FGA. An orthographic projection of the auxiliary scanning line FGA on the base substrate 1000 is overlapped with an orthographic projection of the second channel region T8-A of the active oxide layer of the voltage stabilizing transistor T8 on the base substrate 1000 to form a fourth overlapping region. In this way, the second gate electrode T8-G2 of the voltage stabilizing transistor T8 may be a first part, overlapped with the second channel region T8-A, of the auxiliary scanning line FGA. In this way, the voltage stabilizing transistor T8 is a double-gate transistor. The part, in the second overlapping region, of the second scanning line GA2 is a first gate electrode T8-G1 of the voltage stabilizing transistor T8, and the part, in the fourth overlapping region, of the auxiliary scanning line FGA is a second gate electrode T8-G2 of the voltage stabilizing transistor T8.

Exemplarily, as shown in FIG. 3, FIG. 4D, FIG. 5A to FIG. 6, in the same sub-pixel, the orthographic projection of the auxiliary scanning line FGA on the base substrate 1000 is overlapped with the orthographic projection of the second scanning line GA2 on the base substrate 1000, and the auxiliary scanning line FGA and the second scanning line GA2 in the same sub-pixel are electrically connected.

Exemplarily, the auxiliary scanning line FGA and the second scanning line GA2 in the same sub-pixel may be electrically connected on an edge of an effective display region through a via hole. For another example, the auxiliary scanning line FGA and the second scanning line GA2 in the same sub-pixel may be electrically connected in the display region through the via hole.

Exemplarily, as shown in FIG. 5A and FIG. 5B, a fourth insulating layer 740 is formed on the above-mentioned second conducting layer 200 and is used for protecting the above-mentioned second conducting layer 200. As shown in FIG. 3, FIG. 4E, FIG. 5A to FIG. 6, a third conducting layer 300 of the pixel driving circuit 0121 is shown. The third conducting layer 300 is arranged at a side, facing away from the base substrate 1000, of the fourth insulating layer 740. The third conducting layer 300 may include a plurality of data lines VD, a plurality of power lines Vdd, a plurality of first connection parts 310, a plurality of second connection parts 320, a plurality of third connection parts 330 and a plurality of fourth connection parts 340 spaced from one another. The data lines VD, the power lines Vdd, the first connection parts 310, the second connection parts 320, the third connection parts 330 and the fourth connection parts 340 are spaced from one another.

Exemplarily, as shown in FIG. 3, FIG. 4E, FIG. 5A to FIG. 6, the data lines VD and the power lines Vdd are arranged in a first direction, and the data lines VD and the power lines Vdd extend in a second direction. One of the first connection parts 310, one of the second connection parts 320, one of the third connection parts 330 and one of the fourth connection parts 340 are arranged in one sub-pixel. Exemplarily, a column of sub-pixels corresponds to one of the power lines Vdd and one of the data lines VD. Moreover, in the same sub-pixel, an orthographic projection of the power line Vdd on the base substrate 1000 is located between an orthographic projection of the data line VD on the base substrate 1000 and an orthographic projection of the second connection part 320 on the base substrate 1000. In the same column of sub-pixels, both the orthographic projection of the active silicon layer of the initialization transistor T6 on the base substrate 1000 and the orthographic projection of the active silicon layer of the threshold compensation transistor T3 on the base substrate 1000 are located at a side, facing away from the orthographic projection of the data line VD on the base substrate 1000, of the orthographic projection of the active oxide layer of the voltage stabilizing transistor T8 on the base substrate 1000. For example, the orthographic projection of the active silicon layer of the initialization transistor T6 on the base substrate 1000 is a first orthographic projection, the orthographic projection of the active silicon layer of the threshold compensation transistor T3 on the base substrate 1000 is a second orthographic projection, the orthographic projection of the active oxide layer of the voltage stabilizing transistor T8 on the base substrate 1000 is a third orthographic projection, the orthographic projection of the data line VD on the base substrate 1000 is a fourth orthographic projection, the first orthographic projection is located at a side, facing away from the fourth orthographic projection, of the third orthographic projection, and the second orthographic projection is also located at the side, facing away from the fourth orthographic projection, of the third orthographic projection, so that both the first orthographic projection and the second orthographic projection may be located at the side, facing away from the fourth orthographic projection, of the third orthographic projection.

Exemplarily, as shown in FIG. 5A and FIG. 5B, a fifth insulating layer 750 is formed on the above-mentioned third conducting layer 300 and is used for protecting the above-mentioned third conducting layer 300. As shown in FIG. 3, FIG. 4F, FIG. 5A to FIG. 6, a fourth conducting layer 400 of the pixel driving circuit 0121 is shown. The fourth conducting layer 400 is arranged at a side, facing away from the base substrate 1000, of the fifth insulating layer 750. The fourth conducting layer 400 may include a plurality of initialization lines VINIT spaced from one another, a plurality of auxiliary conducting parts 410 spaced from one another and a plurality of switching parts 420. The initialization lines VINIT, the auxiliary conducting parts 410 and the switching parts 420 are spaced from one another. A sub-pixel is provided with one auxiliary conducting part 410 and one switching part 420. A row of sub-pixels corresponds to one of the initialization lines VINIT. Exemplarily, in the same sub-pixel, an orthographic projection of the initialization line VINIT on the base substrate 1000 is located at the side, facing away from the orthographic projection of the second scanning line GA2 on the base substrate 1000, of the orthographic projection of the first scanning line GA1 on the base substrate 1000.

Figure 5C:
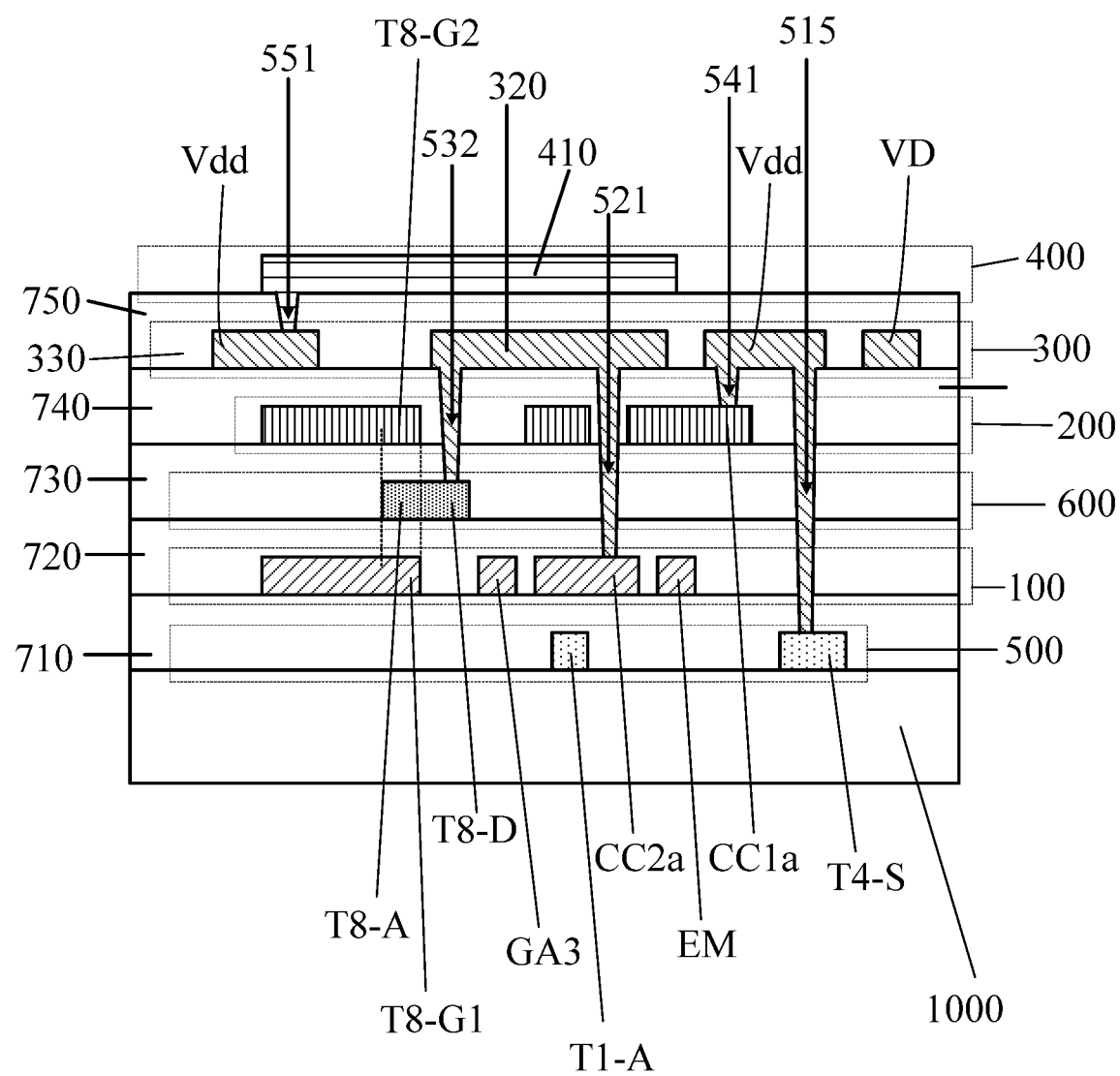
FIG. 5C is a section view in CC' direction in the schematic structural diagram showing the layout of the pixel driving circuit in FIG. 3.
Figure 5D:
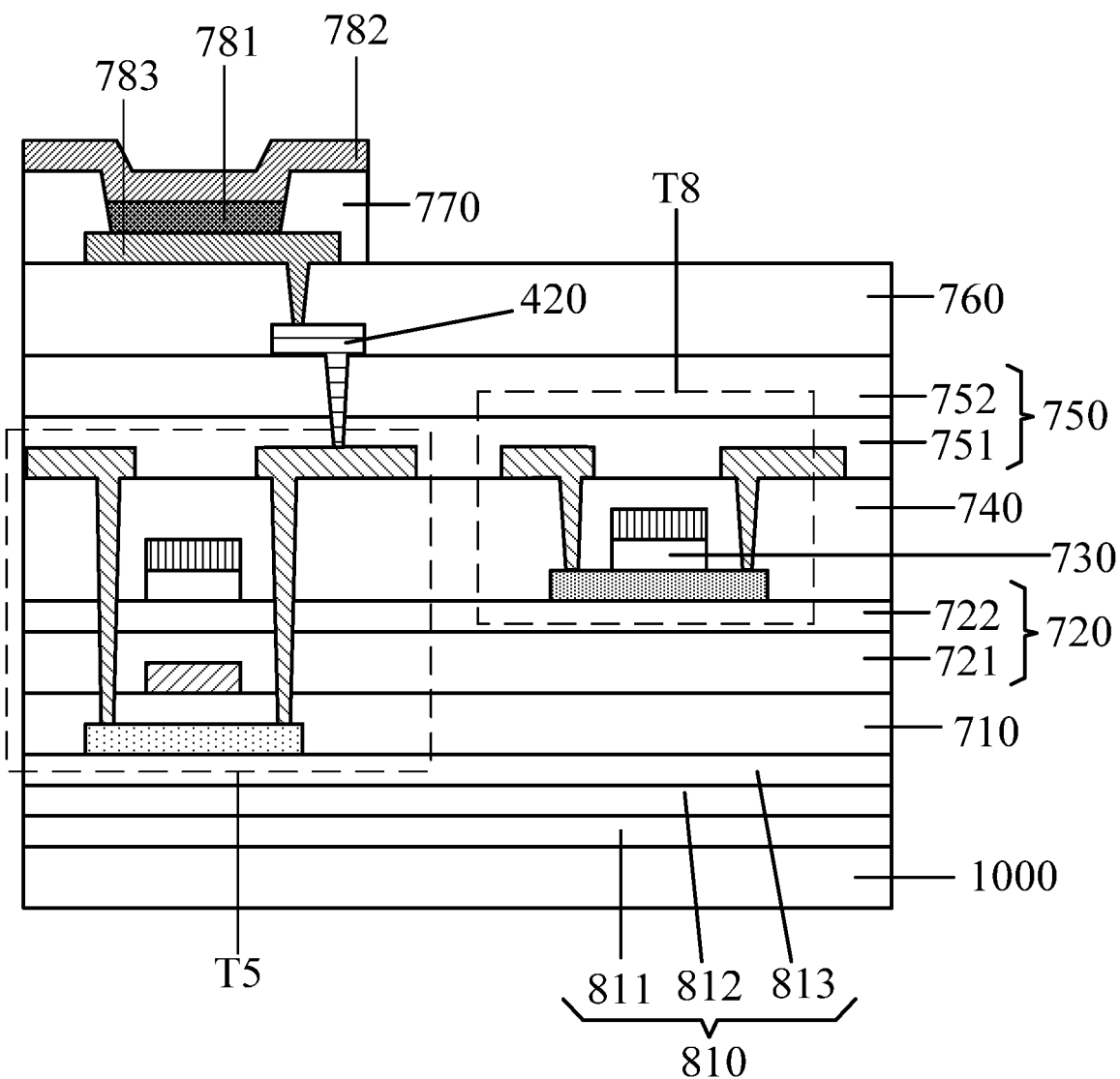
FIG. 5D is a partial section view of the schematic structural diagram showing the layout of the pixel driving circuit in FIG. 3.
Figure 6:
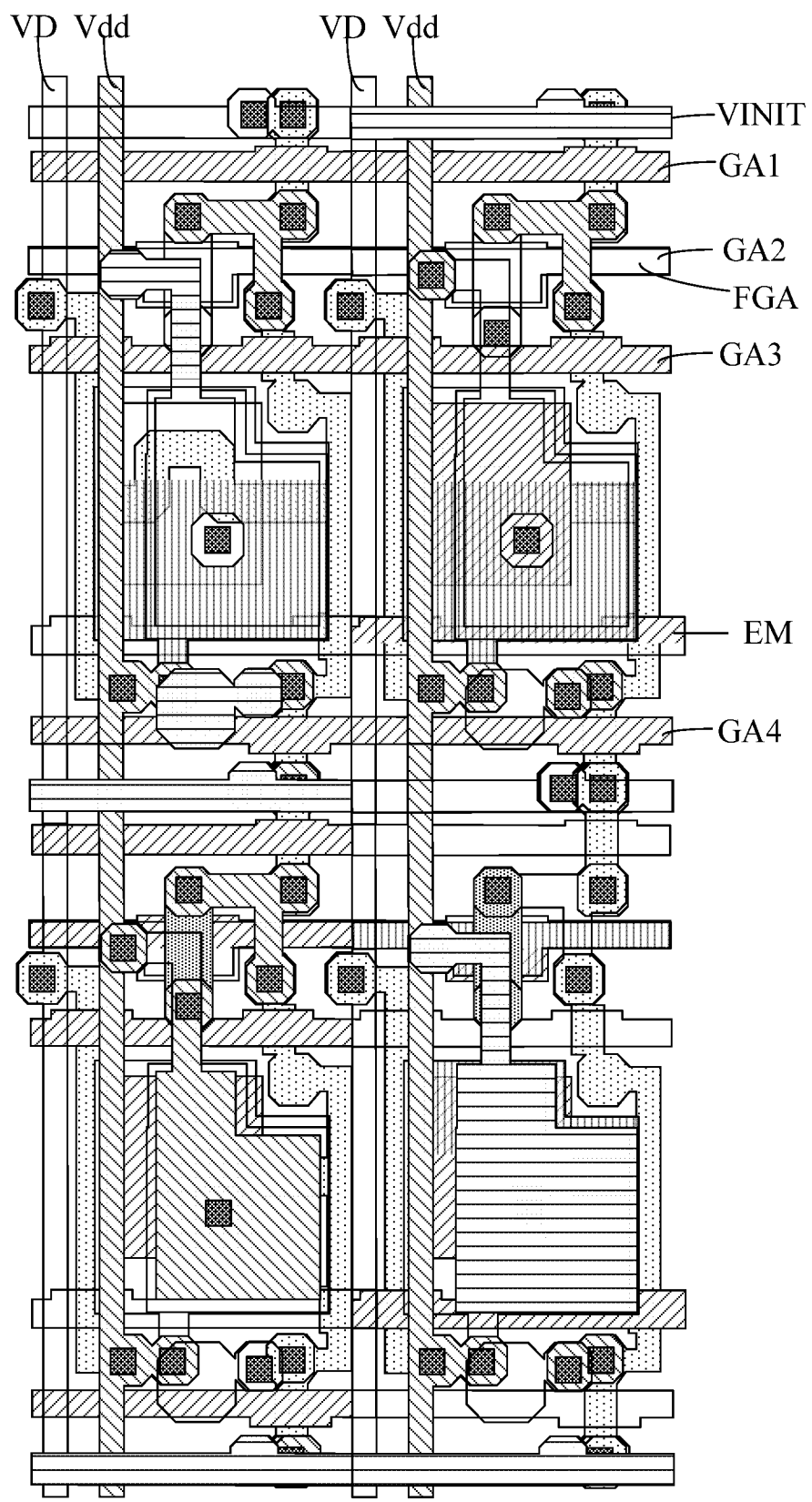
FIG. 6 is a schematic structural diagram showing layout of pixel driving circuits in two rows and two columns of sub-pixels in embodiments of the disclosure.

FIG. 5A is a sectional view in AA' direction in the schematic structural diagram showing the layout of the pixel driving circuit in FIG. 3. FIG. 5B is a sectional view in BB' direction in the schematic structural diagram showing the layout in FIG. 3. FIG. 5C is a sectional view in CC' direction in the schematic structural diagram showing the layout in FIG. 3. FIG. 5D is a partial sectional view in the schematic structural diagram showing the layout in FIG. 3. FIG. 6 is a schematic structural diagram showing layout of pixel driving circuits in two rows and two columns of sub-pixels in embodiments of the disclosure. FIG. 5D only shows the voltage stabilizing transistor T8 and the second light emitting control transistor T5 in the pixel driving circuit 0121.

As shown in FIG. 5A to FIG. 6, a first buffer layer 810 is arranged between the silicon semiconductor layer 500 and the base substrate 1000. The first insulating layer 710 is arranged between the silicon semiconductor layer 500 and the first conducting layer 100. The second insulating layer 720 is arranged between the first conducting layer 100 and the oxide semiconductor layer 600. The third insulating layer 730 is arranged between the oxide semiconductor layer 600 and the second conducting layer 200. The fourth insulating layer 740 is arranged between the second conducting layer 200 and the third conducting layer 300. The fifth insulating layer 750 is arranged between the third conducting layer 300 and the fourth conducting layer 400. Further, the side, facing away from the base substrate 1000, of the fourth conducting layer 400 is provided with a first planarization layer 760. A side, facing away from the base substrate 1000, of the first planarization layer 760 is provided with a first electrode layer. A side, facing away from the base substrate 1000, of the first electrode layer is sequentially provided with a pixel defining layer 770, a light emitting functional layer 781 and a second electrode layer 782. The first electrode layer may include a plurality of first electrodes 783 spaced from one another, and the first electrodes 783 are electrically connected to the switching parts 420 through via holes penetrating through the first planarization layer 760. It should be noted that the via holes penetrating through the first planarization layer 760 are not shown in FIG. 5A and FIG. 5B.

Exemplarily, the above-mentioned insulating layers may be made of organic material or inorganic material (such as SiOx and SiNx), which is not limited herein.

Exemplarily, as shown in FIG. 5D, the first buffer layer 810 may include a first sub-buffer layer 811, a second sub-buffer layer 812 and a third sub-buffer layer 813 which are stacked. The first sub-buffer layer 811 is between the base substrate 1000 and the second sub-buffer layer 812, and the third sub-buffer layer 813 is between the second sub-buffer layer 812 and the silicon semiconductor layer 500. Exemplarily, at least one of the first sub-buffer layer 811, the second sub-buffer layer 812 and the third sub-buffer layer 813 may be set to be made of the inorganic material or the organic material. For example, the first sub-buffer layer 811 is set to be made of the organic material such as PI (Polyimide), and the second sub-buffer layer 812 and the third sub-buffer layer 813 may be set to be made of the inorganic material such as SiOx and SiNx.

Exemplarily, as shown in FIG. 5D, the second insulating layer 720 may include a second sub-insulating layer 721 and a second buffer layer 722 which are stacked. The second sub-insulating layer 721 is located between the first conducting layer 100 and the second buffer layer 722, and the second buffer layer 722 is located between the second sub-insulating layer 721 and the oxide semiconductor layer 600. Exemplarily, the second sub-insulating layer 721 may be set to be made of an inorganic material such as SiNx and SiOx, and SiNx may be adopted during specific implementation. The second buffer layer 722 may be set to be made of an inorganic material such as SiNx and SiOx, and SiOx may be adopted during specific implementation.

Exemplarily, as shown in FIG. 5D, the fifth insulating layer 750 may include a PVX (Passivation) layer 751 and a second planarization layer 752 which are stacked. The PVX layer 751 is located between the third conducting layer 300 and the second planarization layer 752, and the second planarization layer 752 is located between the PVX layer 751 and the fourth conducting layer 400. Exemplarily, the PVX layer 751 may be made of an inorganic material such as SiOx and SiNx, and the second planarization layer 752 may be made of an organic material.

Exemplarily, the sub-pixel spx may include first connection through holes 511, 512, 513, 514, 515 and 516. The sub-pixel spx may include a second connection through hole 521. The sub-pixel spx may include third connection through holes 531 and 532. The sub-pixel spx may include a fourth connection through hole 541. The sub-pixel spx may include fifth connection through holes 551, 552 and 553. The first connection through holes 511, 512, 513, 514, 515 and 516 penetrate through the first insulating layer 710, the second insulating layer 720, the third insulating layer 730 and the fourth insulating layer 740. The second connection through hole 521 penetrates through the second insulating layer 720, the third insulating layer 730 and the fourth insulating layer 740. The third connection through holes 531 and 532 penetrate through the third insulating layer 730 and the fourth insulating layer 740. The fourth connection through hole 541 penetrates through the fourth insulating layer 740. The fifth connection through holes 551, 552 and 553 penetrate through the fifth insulating layer 750. Moreover, the above-mentioned connection through holes are disposed at intervals. Exemplarily, the third connection through hole 531 is used as a first via hole, the first connection through hole 513 is used as a second via hole, and the first connection through hole 512 is used as a third via hole.

In the same sub-pixel, the data line VD is electrically connected to the first region of the data writing transistor T2 in the silicon semiconductor layer 500 through at least one first connection through hole 511. The power line Vdd is electrically connected to a first region T4-S of the first light emitting control transistor T4 in the silicon semiconductor layer 500 through at least one first connection through hole 515 (that is, a fourth via hole). Moreover, the power line Vdd is further electrically connected to the storage conducting part CC1a through at least one fourth connection through hole 541 (that is, an eighth via hole). One end of the third connection part 330 is electrically connected to a first region T6-S of the initialization transistor T6 in the silicon semiconductor layer 500 through at least one first connection through hole 514 (that is, a tenth via hole). The other end of the third connection part 330 is electrically connected to the initialization line VINIT through at least one fifth connection through hole 552 (that is, a ninth via hole). The first connection part 310 is electrically connected to a second region T6-D of the initialization transistor T6 in the silicon semiconductor layer 500 through at least one first connection through hole 513 (that is, the second via hole). The first connection part 310 is further electrically connected to a second region T3-D of the threshold compensation transistor T3 in the silicon semiconductor layer 500 through at least one first connection through hole 512 (that is, the third via hole). The first connection part 310 is further electrically connected to a third region T8-S of the voltage stabilizing transistor T8 in the oxide semiconductor layer 600 through at least one third connection through hole 531 (that is, the first via hole). One end of the fourth connection part 340 is electrically connected to each of a second region T5-D of the second light emitting control transistor T5 in the silicon semiconductor layer 500 and a second region T7-D of the second reset transistor T7 in the silicon semiconductor layer 500 through at least one first connection through hole 516 (that is, a fifth via hole). The other end of the fourth connection part 340 is electrically connected to the switching part 420 through at least one fifth connection through hole 553. One end of the second connection part 320 is electrically connected to a fourth region T8-D of the voltage stabilizing transistor T8 in the oxide semiconductor layer 600 through at least one third connection through hole 532 (that is, a sixth via hole). The other end of the second connection part 320 is electrically connected to the gate electrode CC2a of the driving transistor T1 through at least one second connection through hole 521 (that is, a seventh via hole). The auxiliary conducting part 410 is electrically connected to the power line Vdd through at least one fifth connection through hole 551.

Exemplarily, the number of each of the first connection through holes 511, 512, 513, 514, 515 and 516 in the sub-pixel may be set to be one or two or more. In actual application, the number may be designed and determined according to a demand of an actual application environment, which is not limited herein.

Exemplarily, the number of the second connection through hole 521 in the sub-pixel may be set to be one or two or more. In actual application, the number may be designed and determined according to a demand of an actual application environment, which is not limited herein.

Exemplarily, the number of each of the third connection through holes 531 and 532 in the sub-pixel may be set to be one or two or more. In actual application, the number may be designed and determined according to a demand of an actual application environment, which is not limited herein.

Exemplarily, the number of the fourth connection through hole 541 in the sub-pixel may be set to be one or two or more. In actual application, the number may be designed and determined according to a demand of an actual application environment, which is not limited herein.

Exemplarily, the number of each of the fifth connection through holes 551, 552 and 553 in the sub-pixel may be set to be one or two or more. In actual application, the number may be designed and determined according to a demand of an actual application environment, which is not limited herein.

It should be noted that a positional arrangement relationship among the transistors in each sub-pixel spx is not limited to examples as shown in FIG. 3 to FIG. 4F, and positions of the above-mentioned transistors may be set specifically according to a demand of actual application.

It should be noted that the first direction F1 may be a row direction of the sub-pixels, and the second direction F2 may be a column direction of the sub-pixels. Or, the first direction F1 may be the column direction of the sub-pixels, and the second direction F2 may be the row direction of the sub-pixels. In actual application, the first direction F1 and the second direction F2 may be set according to a demand of actual application, which is not limited herein.

During specific implementation, in embodiments of the present disclosure, as shown in FIG. 3 to FIG. 6, the first region T6-S of the active silicon layer of the initialization transistor T6 is used as the first electrode of the initialization transistor T6, and the second region T6-D of the active silicon layer of the initialization transistor T6 is used as the second electrode of the initialization transistor T6. The third region T8-S of the active oxide layer of the voltage stabilizing transistor T8 is used as the first electrode of the voltage stabilizing transistor T8, and the fourth region T8-D of the active oxide layer of the voltage stabilizing transistor T8 is used as the second electrode of the voltage stabilizing transistor T8. Moreover, in the same sub-pixel, the second region T6-D of the active silicon layer of the initialization transistor T6 is electrically connected to the third region T8-S of the active oxide layer of the voltage stabilizing transistor T8, and the fourth region T8-D of the active oxide layer of the voltage stabilizing transistor T8 is electrically connected to the gate electrode of the driving transistor T1. In this way, an active oxide layer may be arranged between the gate electrode of the driving transistor and the second region T6-D of the active silicon layer of the initialization transistor T6, so that a signal flow path between the gate electrode of the driving transistor and the second region T6-D of the active silicon layer of the initialization transistor T6 may pass through the active oxide layer. Since the transistor with the active layer made of a metal oxide semiconductor material generates a little leakage current, an off-state current of the voltage stabilizing transistor T8 is relatively small and is even negligible. Therefore, influences of the leakage current to the voltage of the gate electrode of the driving transistor may be reduced, and the stability of the voltage of the gate electrode of the driving transistor may be improved.

During specific implementation, in embodiments of the disclosure, as shown in FIG. 3 to FIG. 6, a first region T3-S of the active silicon layer of the threshold compensation transistor T3 is used as the first electrode of the threshold compensation transistor T3, and a second region T3-D of the active silicon layer of the threshold compensation transistor T3 is used as the second electrode of the threshold compensation transistor T3. A first region T1-S of the active silicon layer of the driving transistor T1 is used as the first electrode of the driving transistor T1, and a second region T1-D of the active silicon layer of the driving transistor T1 is used as the second electrode of the driving transistor T1. Moreover, in the same sub-pixel, the second region T3-D of the active silicon layer of the threshold compensation transistor T3 is electrically connected to the third region T8-S of the active oxide layer of the voltage stabilizing transistor T8, and the first region T3-S of the active silicon layer of the threshold compensation transistor T3 is electrically connected to the second region T1-D of the active silicon layer of the driving transistor T1. In this way, an active oxide layer may be arranged between the gate electrode of the driving transistor and the second region T3-D of the active silicon layer of the threshold compensation transistor T3, so that a signal flow path between the gate electrode of the driving transistor and the second region T3-D of the active silicon layer of the threshold compensation transistor T3 may pass through the active oxide layer. Since the transistor with the active layer made of a metal oxide semiconductor material generates a little leakage current, an off-state current of the voltage stabilizing transistor T8 is relatively small and is even negligible. Therefore, influences of the leakage current to the voltage of the gate electrode of the driving transistor may be reduced, and the stability of the voltage of the gate electrode of the driving transistor may be improved.

During specific implementation, in embodiments of the disclosure, as shown in FIG. 3, FIG. 4E, FIG. 5A to FIG. 6, the first connection part 310 may include a first sub-connection part and a second sub-connection part which are electrically connected with each other. A first end of the first sub-connection part is electrically connected to the third region T8-S of the active oxide layer of the voltage stabilizing transistor T8 through the first via hole (that is, the third connection through hole 531), and a second end of the first sub-connection part is electrically connected to the second region T6-D of the active silicon layer of the initialization transistor T6 through the second via hole (that is, the first connection through hole 513). A first end of the second sub-connection part is electrically connected to the second region T3-D of the active silicon layer of the threshold compensation transistor T3 through the third via hole (that is, the first connection through hole 512), and a second end of the second sub-connection part is electrically connected to the first sub-connection part.

Figure 4E:
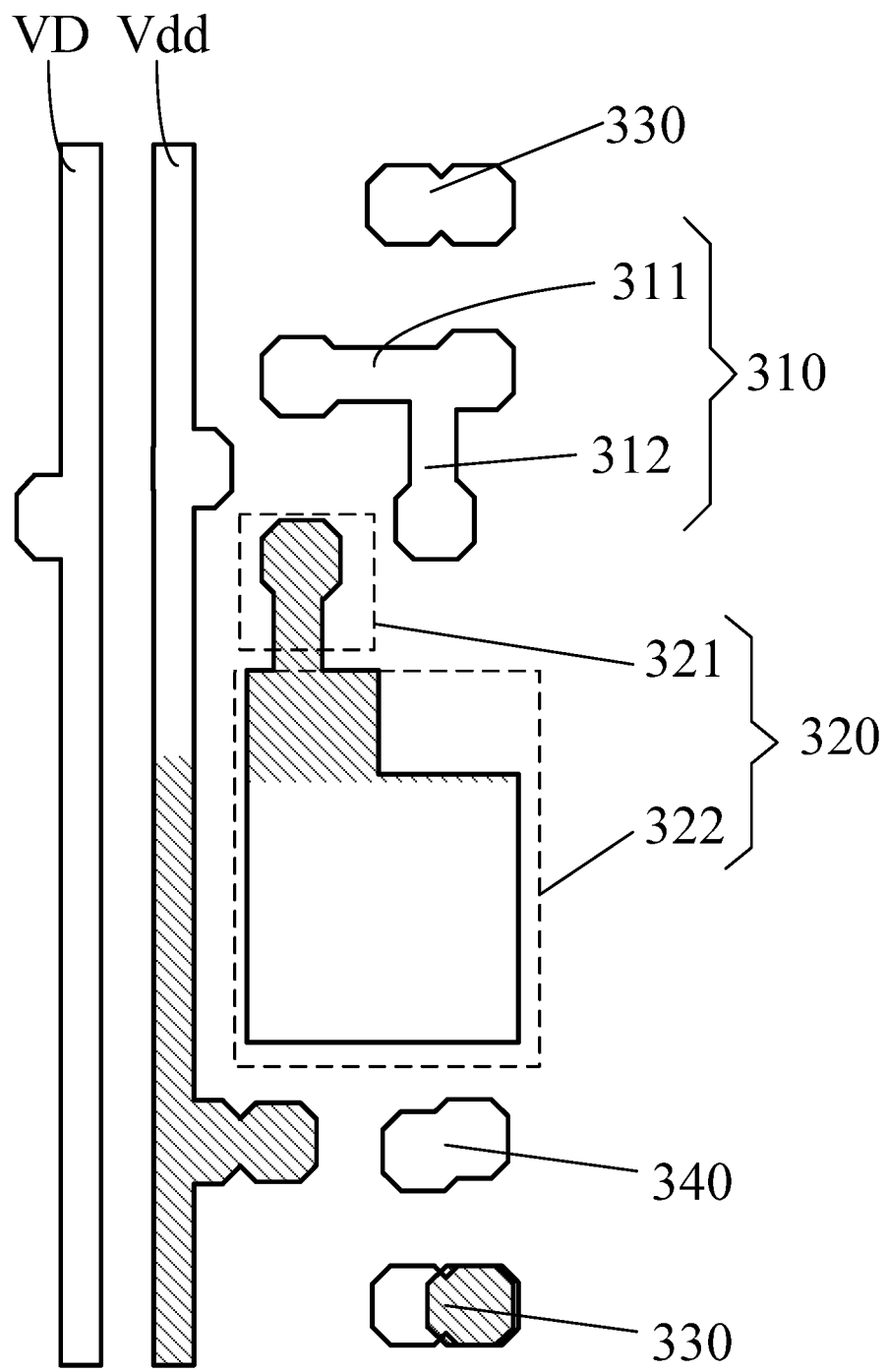
FIG. 4E is a schematic structural diagram of a third conducting layer provided by embodiments of the disclosure.
Figure 4F:
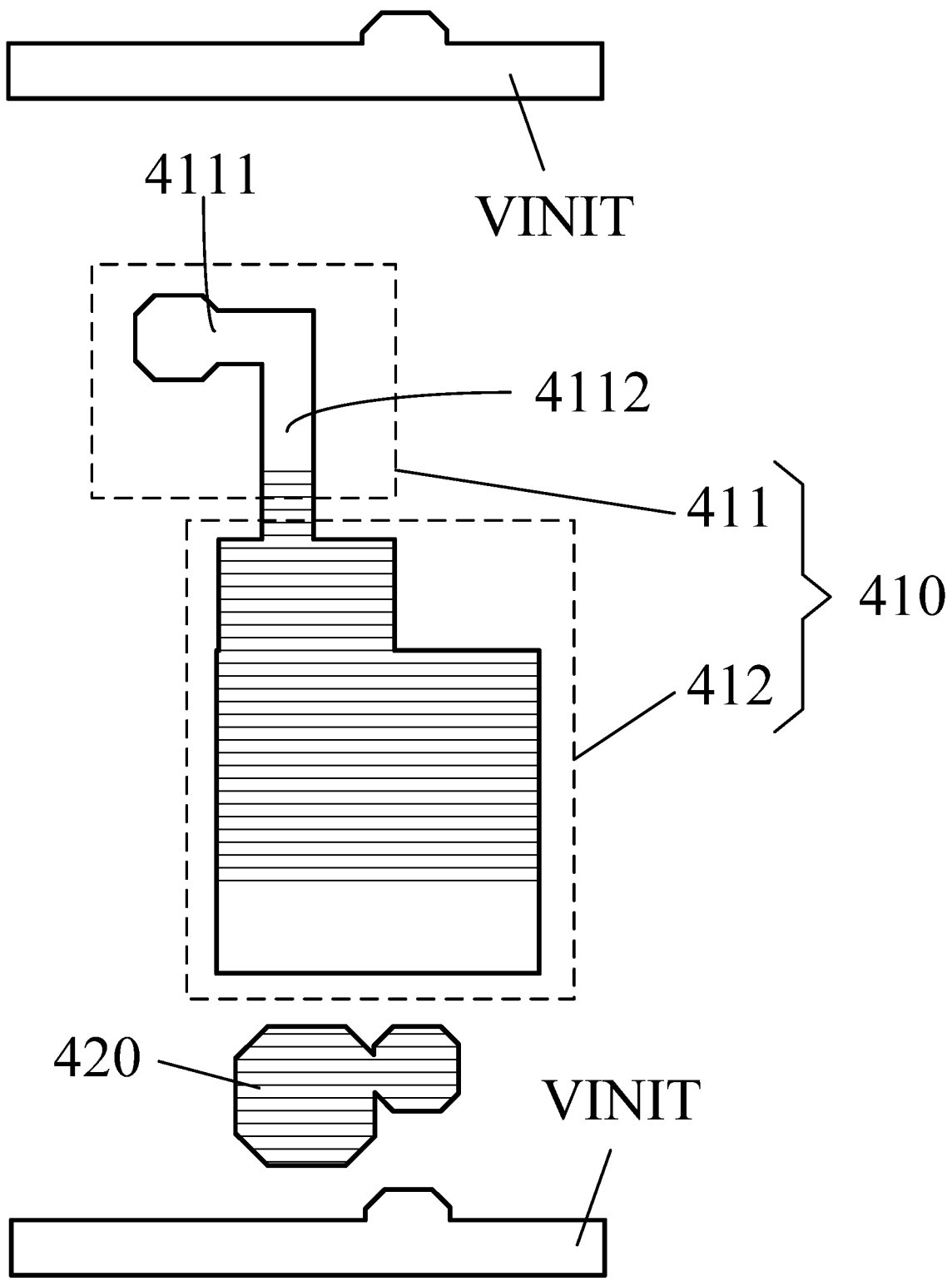
FIG. 4F is a schematic structural diagram of a fourth conducting layer provided by embodiments of the disclosure.

During specific implementation, in embodiments of the disclosure, as shown in FIG. 3 and FIG. 4E, the first sub-connection part may extend in the first direction. For example, the first sub-connection part may extend in a straight line in the first direction, in other words, an extension direction of the first sub-connection part may be approximately parallel to the first direction F1. It should be noted that, in an actual process, due to restrictions of process conditions or other factors, the extension direction of the first sub-connection part may not be completely parallel to the first direction F1, it is possible to generate some deviations, and therefore, as long as the extension direction of the above-mentioned first sub-connection part and the first direction F1 approximately meet parallel conditions, it shall fall within the protective scope of the disclosure. For example, the above-mentioned parallel may be allowed within an error allowable range.

During specific implementation, in embodiments of the disclosure, as shown in FIG. 3 and FIG. 4E, the second sub-connection part may extend in the second direction. For example, the second sub-connection part may extend in a straight line in the second direction, in other words, an extension direction of the second sub-connection part may be approximately parallel to the second direction F2. It should be noted that, in an actual process, due to restrictions of process conditions or other factors, the extension direction of the second sub-connection part may not be completely parallel to the second direction F2, it is possible to generate some deviations, and therefore, as long as the extension direction of the above-mentioned second sub-connection part and the second direction F2 approximately meet parallel conditions, it shall fall within the protective scope of the disclosure. For example, the above-mentioned parallel may be allowed within an error allowable range.

During specific implementation, in embodiments of the disclosure, as shown in FIG. 3, an orthographic projection of the first connection part on the base substrate 1000 may be approximately T-shaped. Or, the third connection through hole 531 is used as the first via hole, the first connection through hole 513 is used as the second via hole, and the first connection through hole 512 is used as the third via hole. In the same sub-pixel, the first via hole, the second via hole and the third via hole may be approximately arranged in a triangle. Further, in the same sub-pixel, the first via hole and the second via hole extend approximately in a straight line in the first direction F1. An orthographic projection of the third via hole on a straight line where the first via hole and the second via hole are located is close to the second via hole. It should be noted that, in an actual process, due to restrictions of process conditions or other factors, the orthographic projection of the first connection part on the base substrate 1000 may not be completely T-shaped, and the first via hole and the second via hole may not completely extend in a straight line in the first direction F1, it is possible to generate some deviations, and therefore, the above-mentioned ways shall fall within the protective scope of the disclosure as long as parallel conditions are approximately met. For example, the above-mentioned ways may be allowed within an error allowable range.

During specific implementation, in embodiments of the disclosure, as shown in FIG. 3, in the same sub-pixel, an orthographic projection of the first sub-connection part on the base substrate 1000 is located between the orthographic projection of the first scanning line GA1 on the base substrate 1000 and the orthographic projection of the second scanning line GA2 on the base substrate 1000, and an orthographic projection of the second sub-connection part on the base substrate 1000 is overlapped with the orthographic projection of the second scanning line GA2 on the base substrate 1000 to form an overlapping region. Exemplarily, in the same row of sub-pixels, an orthographic projection of the first via hole (that is, the third connection through hole 531) on the base substrate 1000 and an orthographic projection of the second via hole (that is, the first connection through hole 513) on the base substrate 1000 are approximately arranged in a straight line in the first direction F1.

During specific implementation, in embodiments of the disclosure, as shown in FIG. 3, FIG. 4D, FIG. 5A to FIG. 6, the first region T4-S of the active silicon layer of the first light emitting control transistor T4 is used as the first electrode of the first light emitting control transistor T4, and the second region T4-D of the active silicon layer of the first light emitting control transistor T4 is used as the second electrode of the first light emitting control transistor T4. The first region T5-S of the active silicon layer of the second light emitting control transistor T5 is used as the first electrode of the second light emitting control transistor T5, and the second region T5-D of the active silicon layer of the second light emitting control transistor T5 is used as the second electrode of the second light emitting control transistor T5. Exemplarily, the second region T4-D of the active silicon layer of the first light emitting control transistor T4 is electrically connected to the first region T1-S of the active silicon layer of the driving transistor T1, and the first region T5-S of the active silicon layer of the second light emitting control transistor T5 is electrically connected to the second region T1-D of the active silicon layer of the driving transistor T1, and the second region T5-D of the active silicon layer of the second light emitting control transistor T5 is electrically connected to the first electrode of the light emitting device through the fifth via hole.

During specific implementation, in embodiments of the disclosure, as shown in FIG. 3 to FIG. 6, the second connection part 320 includes a first conducting part 321 and a first main part 322. The first conducting part 321 is electrically connected to the fourth region T8-D of the active oxide layer of the voltage stabilizing transistor T8 through the sixth via hole (that is, the third connection through hole 532). Moreover, an orthographic projection of the first conducting part 321 on the base substrate 1000 is respectively overlapped with the orthographic projection of the third scanning line GA3 on the base substrate 1000 and the orthographic projection of the fourth region T8-D of the active oxide layer of the voltage stabilizing transistor T8 on the base substrate 1000 to form overlapping regions. In addition, an orthographic projection of the first main part 322 on the base substrate 1000 is overlapped with the orthographic projection of the gate electrode of the driving transistor T1 on the base substrate 1000 to form an overlapping region, and the orthographic projection of the first main part 322 on the base substrate 1000 is not overlapped with the orthographic projection of the third scanning line GA3 on the base substrate 1000.

During specific implementation, in embodiments of the disclosure, as shown in FIG. 3 to FIG. 6, in the same sub-pixel, the orthographic projection of the first main part 322 on the base substrate 1000 is at least partially not overlapped with an orthographic projection of the first region T5-S of the second light emitting control transistor T5 on the base substrate 1000. Exemplarily, the orthographic projection of the first main part 322 on the base substrate 1000 may be tangent to the orthographic projection of the first region T5-S of the second light emitting control transistor T5 on the base substrate 1000. Or, the orthographic projection of the first main part 322 on the base substrate 1000 may be not overlapped with the orthographic projection of the first region T5-S of the second light emitting control transistor T5 on the base substrate 1000. Of course, the present disclosure includes, but is not limited to this.

During specific implementation, in embodiments of the disclosure, as shown in FIG. 3 to FIG. 6, in the same sub-pixel, the orthographic projection of the first main part 322 on the base substrate 1000 is tangent to the orthographic projection of the light emitting control line EM on the base substrate 1000, the orthographic projection of the first main part 322 on the base substrate 1000 is close to the orthographic projection of the power line Vdd on the base substrate 1000, and the orthographic projection of the first main part 322 on the base substrate 1000 is close to the orthographic projection of the third scanning line GA3 on the base substrate 1000.

During specific implementation, in embodiments of the disclosure, as shown in FIG. 3 to FIG. 6, in the same sub-pixel, an orthographic projection of the storage conducting part CC1a on the base substrate 1000 respectively covers the orthographic projection of the gate electrode of the driving transistor T1 on the base substrate 1000 and the orthographic projection of the first main part 322 on the base substrate 1000. The orthographic projection of the storage conducting part CC1a on the base substrate 1000 is not overlapped with an orthographic projection of the seventh via hole (that is, the second connection through hole 521) on the base substrate 1000, and the orthographic projection of the storage conducting part CC1a on the base substrate 1000 is not overlapped with the orthographic projection of the third scanning line GA3 on the base substrate 1000.

During specific implementation, in embodiments of the disclosure, as shown in FIG. 3 to FIG. 6, in the same sub-pixel, the orthographic projection of the storage conducting part CC1a on the base substrate 1000 is overlapped with the orthographic projection of the power line Vdd on the base substrate 1000 to form an overlapping region, and the orthographic projection of the storage conducting part CC1a on the base substrate 1000 is not overlapped with the orthographic projection of the data line VD on the base substrate 1000. In this way, a signal on the storage conducting part CC1a may be prevented from being interfered by a signal transmitted on the data line VD. Moreover, the voltage transmitted by the power line Vdd is a fixed voltage, the orthographic projection of the storage conducting part CC1a on the base substrate 1000 is overlapped with the orthographic projection of the power line Vdd on the base substrate 1000 to form the overlapping region, and thus, not only may an area of the storage conducting part CC1a be increased, but also signal interference may be reduced.

During specific implementation, in embodiments of the disclosure, as shown in FIG. 3 to FIG. 6, in the same sub-pixel, orthographic projections of the eighth via hole (that is, the fourth connection through hole 541), the fourth via hole (that is, the first connection through hole 515) and the fifth via hole (that is, the first connection through hole 516) on the base substrate 1000 are located between the orthographic projection of the light emitting control line EM on the base substrate 1000 and the orthographic projection of the fourth scanning line GA4 on the base substrate 1000.

During specific implementation, in embodiments of the disclosure, as shown in FIG. 3 to FIG. 6, in the same row of sub-pixels, the orthographic projections of the eighth via hole (that is, the fourth connection through hole 541), the fourth via hole (that is, the first connection through hole 515) and the fifth via hole (that is, the first connection through hole 516) on the base substrate 1000 are approximately arranged in a straight line in the first direction F1.

During specific implementation, in embodiments of the disclosure, as shown in FIG. 3 to FIG. 6, the auxiliary conducting part 410 may include a second conducting part 411 and a second main part 412 electrically connected to each other. The second conducting part 411 is electrically connected to the power line Vdd through at least one fifth connection through hole 551. Moreover, an orthographic projection of the second main part 412 on the base substrate 1000 covers the orthographic projection of the first main part 322 on the base substrate 1000. In this way, the auxiliary conducting part and the storage conducting part CC1a in the same sub-pixel may be electrically connected.

During specific implementation, in embodiments of the disclosure, as shown in FIG. 3 to FIG. 6, the sub-pixel may further include an eleventh via hole (that is, the fifth connection through hole 551). Moreover, the second conducting part 411 may include a first sub-conducting part 4111 and a second sub-conducting part 4112. The first sub-conducting part 4111 extends in the first direction F1, and the second sub-conducting part 4112 extends in the second direction F2; a first end of the first sub-conducting part 4111 is electrically connected to the power line Vdd through the eleventh via hole (that is, the fifth connection through hole 551), a second end of the first sub-conducting part 4111 is electrically connected to a first end of the second sub-conducting part 4112, and a second end of the second sub-conducting part 4112 is electrically connected to the second main part 412. Moreover, the orthographic projection of the third scanning line GA3 on the base substrate 1000 is overlapped with an orthographic projection of the first sub-conducting part 4111 on the base substrate 1000 to form an overlapping region, and an orthographic projection of the second end of the first sub-conducting part 4111 on the base substrate 1000 is overlapped with the orthographic projection of the second channel region T8-A of the oxide semiconductor layer of the voltage stabilizing transistor T8 on the base substrate 1000 to form an overlapping region. In addition, an orthographic projection of the second sub-conducting part 4112 on the base substrate 1000 is respectively overlapped with an orthographic projection of the sixth via hole on the base substrate 1000 and the orthographic projection of the third scanning line GA3 on the base substrate 1000 to form overlapping regions.

It should be noted that the auxiliary conducting part 410, the storage conducting part CC1a and the power line Vdd in the same sub-pixel are electrically connected to form the first electrode of the storage capacitor CST, so that the auxiliary conducting part 410 and the storage conducting part CC1a have the same potential which is the potential of the power line Vdd. Moreover, the gate electrode CC2a of the driving transistor T1 is electrically connected to the second connection part 320 to form the second electrode of the storage capacitor CST, so that the gate electrode CC2a of the driving transistor T1 and the second connection part 320 have the same potential which is the potential of the gate electrode of the driving transistor T1. In this way, the storage capacitor may include four stacked substrates, thereby increasing an area and a capacitance value of the storage capacitor CST under the condition that the occupied space is not increased.

During specific implementation, the second planarization layer 752 at the corresponding positions of the auxiliary conducting part 410 and the second connection part 320 may be thinned or removed, and thus, the capacitance value of the storage capacitor CST may be increased.

Based on the same inventive concept, embodiments of the disclosure further provide a display device, including the above-mentioned display panel provided by the embodiments of the disclosure. The implementation of the display device may refer to the embodiments of the above-mentioned display panel, the repetition parts are not described herein.

During specific implementation, in embodiments of the disclosure, the display device may be any product or component with a display function, such as a mobile phone, a tablet personal computer, a television, a display, a notebook computer, a digital photo frame and a navigator. The existence of other essential components of the display device should be understood by those of ordinary skill in the art, which is not described herein, and should not be regarded as limitations on the disclosure.

Although preferred embodiments of the present disclosure have been described, those skilled in the art can make additional alterations and modifications on these embodiments once they know the basic creative concept. Therefore, the appended claims are intended to be interpreted to include the preferred embodiments and all the alterations and modifications falling within the scope of the disclosure.

Obviously, those skilled in the art can make various alterations and variations on the embodiments of the disclosure without departing from the spirit and scope of the embodiments of the disclosure. In this way, if these alterations and variations of the embodiments of the disclosure fall within the scope of the claims of the disclosure and equivalent technologies of the claims, the disclosure is also intended to include these alterations and variations.

What is claimed is:
1. A display panel, comprising:
  a base substrate, provided with a plurality of sub-pixels, at least one of the plurality of sub-pixels comprising a pixel circuit, wherein the pixel circuit comprises a driving transistor, an initialization transistor, a voltage stabilizing transistor, and a threshold compensation transistor;

a silicon semiconductor layer, on the base substrate, the silicon semiconductor layer comprising an active silicon layer of the driving transistor, an active silicon layer of the initialization transistor, and an active silicon layer of the threshold compensation transistor, wherein the active silicon layer of the driving transistor, the active silicon layer of the initialization transistor, and the active silicon layer of the threshold compensation transistor each is provided with a first region, a second region and a first channel region between the first region and the second region;

a first insulating layer, at a side, facing away from the base substrate, of the silicon semiconductor layer;

a first conducting layer, at a side, facing away from the base substrate, of the first insulating layer, the first conducting layer comprising a gate electrode of the driving transistor, a gate electrode of the initialization transistor, and a gate electrode of the threshold compensation transistor;

a second insulating layer, at a side, facing away from the base substrate, of the first conducting layer; and an oxide semiconductor layer, at a side, facing away from the base substrate, of the second insulating layer, the oxide semiconductor layer comprising an active oxide layer of the voltage stabilizing transistor, wherein the active oxide layer is provided with a third region, a fourth region and a second channel region between the third region and the fourth region;

wherein in a same sub-pixel, the second region of the active silicon layer of the initialization transistor is electrically connected to the third region of the active oxide layer of the voltage stabilizing transistor, and the fourth region of the active oxide layer of the voltage stabilizing transistor is electrically connected to the gate electrode of the driving transistor; and in the same sub-pixel, the second region of the active silicon layer of the threshold compensation transistor is electrically connected to the third region of the active oxide layer of the voltage stabilizing transistor, and the first region of the active silicon layer of the threshold compensation transistor is electrically connected to the second region of the active silicon layer of the driving transistor;

wherein the first conducting layer further comprises a plurality of first scanning lines and a plurality of third scanning lines spaced from one another, wherein the first scanning lines and the third scanning lines extend in a first direction and are arranged in a second direction;

an orthographic projection of each of the first scanning lines on the base substrate is overlapped with an orthographic projection of the first channel region of the active silicon layer of the initialization transistor on the base substrate to form a first overlapping region, and a part, in the first overlapping region, of the each of the first scanning lines is the gate electrode of the initialization transistor; and an orthographic projection of each of the third scanning lines on the base substrate is overlapped with an orthographic projection of the first channel region of the active silicon layer of the threshold compensation transistor on the base substrate to form a third overlapping region, and a part, in the third overlapping region, of the each of the third scanning lines is the gate electrode of the threshold compensation transistor.

2. The display panel according to claim 1, further comprising:

a plurality of second scanning lines, wherein the second scanning lines extend in a first direction and are arranged in a second direction;

an orthographic projection of each of the second scanning lines on the base substrate is overlapped with an orthographic projection of the second channel region of the active oxide layer of the voltage stabilizing transistor on the base substrate to form a second overlapping region, and a part, in the second overlapping region, of the each of the second scanning lines is a gate electrode of the voltage stabilizing transistor.

3. The display panel according to claim 2, wherein a row of sub-pixels comprises the first scanning line, the second scanning line and the third scanning line; and in the same sub-pixel, the orthographic projection of the second scanning line on the base substrate is between the orthographic projection of the first scanning line on the base substrate and the orthographic projection of the third scanning line on the base substrate, an orthographic projection of the active oxide layer of the voltage stabilizing transistor on the base substrate is between the orthographic projection of the first scanning line on the base substrate and the orthographic projection of the third scanning line on the base substrate, and the orthographic projection of the second scanning line on the base substrate is respectively not overlapped with an orthographic projection of the active silicon layer of the threshold compensation transistor on the base substrate and an orthographic projection of the active silicon layer of the initialization transistor on the base substrate.

4. The display panel according to claim 3, wherein the active oxide layer of the voltage stabilizing transistor extends approximately in a straight line in the second direction; and the active silicon layer of at least one of the initialization transistor and the threshold compensation transistor extends approximately in a straight line in the second direction.

5. The display panel according to claim 2, wherein the display panel further comprises:

a third insulating layer, at a side, facing away from the base substrate, of the oxide semiconductor layer;

a second conducting layer, at the side, facing away from the base substrate, of the third insulating layer;

a fourth insulating layer, at a side, facing away from the base substrate, of the second conducting layer; and a third conducting layer, at a side, facing away from the base substrate, of the fourth insulating layer, and the third conducting layer comprising a plurality of data lines spaced from one another, wherein a column of sub-pixels comprises a data line; and in a same column of sub-pixels, both the orthographic projection of the active silicon layer of the initialization transistor on the base substrate and the orthographic projection of the active silicon layer of the threshold compensation transistor on the base substrate are at a side, facing away from an orthographic projection of the data line on the base substrate, of the orthographic projection of the active oxide layer of the voltage stabilizing transistor on the base substrate.

6. The display panel according to claim 5, wherein the third conducting layer further comprises a plurality of first connection parts; one of the sub-pixels comprises a first connection part;
  the sub-pixel further comprises a first via hole, a second via hole and a third via hole spaced from one another, wherein the first via hole penetrates through the third insulating layer and the fourth insulating layer, and both the second via hole and the third via hole penetrate through the first insulating layer, the second insulating layer, the third insulating layer and the fourth insulating layer; and
  in the same sub-pixel, the first connection part is electrically connected to the third region of the active oxide layer of the voltage stabilizing transistor through the first via hole, the first connection part is electrically connected to the second region of the active silicon layer of the initialization transistor through the second via hole, and the first connection part is electrically connected to the second region of the active silicon layer of the threshold compensation transistor through the third via hole.

7. The display panel according to claim 6, wherein the first connection part comprises a first sub-connection part and a second sub-connection part electrically connected to each other;
  a first end of the first sub-connection part is electrically connected to the third region of the active oxide layer of the voltage stabilizing transistor through the first via hole, and a second end of the first sub-connection part is electrically connected to the second region of the active silicon layer of the initialization transistor through the second via hole; and
  a first end of the second sub-connection part is electrically connected to the second region of the active silicon layer of the threshold compensation transistor through the third via hole, and a second end of the second sub-connection part is electrically connected to the first sub-connection part.

8. The display panel according to claim 7, wherein the first sub-connection part extends in the first direction, and the second sub-connection part extends in the second direction; and
  in a same row of sub-pixels, an orthographic projection of the first sub-connection part on the base substrate is between the orthographic projection of the first scanning line on the base substrate and the orthographic projection of the second scanning line on the base substrate, and an orthographic projection of the second sub-connection part on the base substrate is overlapped with the orthographic projection of the second scanning line on the base substrate to form an overlapping region.

9. The display panel according to claim 5, wherein the second conducting layer comprises a plurality of auxiliary scanning lines spaced from one another; a row of sub-pixels comprises an auxiliary scanning line;
  in the same sub-pixel, an orthographic projection of the auxiliary scanning line on the base substrate is overlapped with the orthographic projection of the second channel region of the active oxide layer of the voltage stabilizing transistor on the base substrate to form a fourth overlapping region; and
  the voltage stabilizing transistor is a double-gate transistor, wherein the part, in the second overlapping region, of the second scanning line is a first gate electrode of the voltage stabilizing transistor, and a part, in the fourth overlapping region, of the auxiliary scanning line is a second gate electrode of the voltage stabilizing transistor.

10. The display panel according to claim 9, wherein in the same sub-pixel, the orthographic projection of the auxiliary scanning line on the base substrate is overlapped with the orthographic projection of the second scanning line on the base substrate, and the auxiliary scanning line and the second scanning line in the same sub-pixel are electrically connected.

11. The display panel according to claim 5, wherein the third conducting layer further comprises a plurality of second connection parts, and a plurality of power lines spaced from the data lines and the second connection parts; wherein a column of sub-pixels comprises a power line; one of the sub-pixels comprises a second connection part; and
  in the same sub-pixel, an orthographic projection of the power line on the base substrate is between the orthographic projection of the data line on the base substrate and an orthographic projection of the second connection part on the base substrate.

12. The display panel according to claim 11, wherein the sub-pixel further comprises a first light emitting control transistor and a second light emitting control transistor as well as a fourth via hole and a fifth via hole spaced from each other, wherein both the fourth via hole and the fifth via hole penetrate through the first insulating layer, the second insulating layer, the third insulating layer and the fourth insulating layer;
  the silicon semiconductor layer further comprises an active silicon layer of the first light emitting control transistor and an active silicon layer of the second light emitting control transistor; the active silicon layer of the first light emitting control transistor and the active silicon layer of the second light emitting control transistor each is provided with the first region, the second region and the first channel region between the first region and the second region;
  the first conducting layer further comprises a gate electrode of the first light emitting control transistor and a gate electrode of the second light emitting control transistor; and
  in the same sub-pixel, the power line is electrically connected to the first region of the active silicon layer of the first light emitting control transistor through the fourth via hole, the second region of the active silicon layer of the first light emitting control transistor is electrically connected to the first region of the active silicon layer of the driving transistor, the first region of the active silicon layer of the second light emitting control transistor is electrically connected to the second region of the active silicon layer of the driving transistor, and the second region of the active silicon layer of the second light emitting control transistor is electrically connected to a first electrode of a light emitting device through the fifth via hole.

13. The display panel according to claim 12, wherein the first conducting layer further comprises a plurality of light emitting control lines and a plurality of fourth scanning lines spaced from each other, wherein a row of sub-pixels comprises a light emitting control line and a fourth scanning line;
  in the same sub-pixel, an orthographic projection of the light emitting control line on the base substrate is at a side, facing away from the orthographic projection of the second scanning line on the base substrate, of the orthographic projection of the third scanning line on the base substrate, an orthographic projection of the fourth scanning line on the base substrate is a side, facing away from the orthographic projection of the second scanning line on the base substrate, of the orthographic projection of the light emitting control line on the base substrate, and both orthographic projections of the active silicon layer and the gate electrode of the driving transistor on the base substrate are between the orthographic projection of the light emitting control line on the base substrate and the orthographic projection of the third scanning line on the base substrate;

the orthographic projection of the light emitting control line on the base substrate is overlapped with the first channel region of the active silicon layer of the first light emitting control transistor to form a fourth overlapping region, and a part, in the fourth overlapping region, of the light emitting control line is the gate electrode of the first light emitting control transistor; and the orthographic projection of the light emitting control line on the base substrate is overlapped with the first channel region of the active silicon layer of the second light emitting control transistor to form a fifth overlapping region, and a part, in the fifth overlapping region, of the light emitting control line is the gate electrode of the second light emitting control transistor.

14. The display panel according to claim 13, wherein;

the sub-pixel further comprises a sixth via hole and a seventh via hole, wherein the sixth via hole penetrates through the third insulating layer and the fourth insulating layer, and the seventh via hole penetrates through the second insulating layer, the third insulating layer and the fourth insulating layer; and the second connection part is electrically connected to the fourth region of the active oxide layer of the voltage stabilizing transistor through the sixth via hole, and the second connection part is electrically connected to the gate electrode of the driving transistor through the seventh via hole.

15. The display panel according to claim 14, wherein the second connection part comprises a first conducting part and a first main part, wherein the first conducting part is electrically connected to the fourth region of the active oxide layer of the voltage stabilizing transistor through the sixth via hole;

an orthographic projection of the first conducting part on the base substrate is respectively overlapped with the orthographic projection of the third scanning line on the base substrate and an orthographic projection of the fourth region of the active oxide layer of the voltage stabilizing transistor on the base substrate to form overlapping regions; and an orthographic projection of the first main part on the base substrate is overlapped with an orthographic projection of the gate electrode of the driving transistor on the base substrate to form an overlapping region, and the orthographic projection of the first main part on the base substrate is not overlapped with the orthographic projection of the third scanning line on the base substrate.

16. The display panel according to claim 15, wherein the display panel further comprises:

a fifth insulating layer, at a side, facing away from the base substrate, of the third conducting layer; and a fourth conducting layer, at a side, facing away from the base substrate, of the fifth insulating layer, and the fourth conducting layer comprising a plurality of auxiliary conducting parts spaced from one another, wherein one of the sub-pixels comprises an auxiliary conducting part;

wherein in the same sub-pixel, the auxiliary conducting part is electrically connected to the power line.

17. The display panel according to claim 16, wherein the auxiliary conducting part comprises a second conducting part and a second main part electrically connected to each other, wherein the second conducting part is electrically connected to the power line; and an orthographic projection of the second main part on the base substrate covers the orthographic projection of the first main part on the base substrate.

18. The display panel according to claim 17, wherein the sub-pixel further comprises an eleventh via hole; the eleventh via hole penetrates through the fifth insulating layer;

the second conducting part comprises a first sub-conducting part and a second sub-conducting part, wherein the first sub-conducting part extends in the first direction, and the second sub-conducting part extends in the second direction; a first end of the first sub-conducting part is electrically connected to the power line through the eleventh via hole, a second end of the first sub-conducting part is electrically connected to a first end of the second sub-conducting part, and a second end of the second sub-conducting part is electrically connected to the second main part;

the orthographic projection of the third scanning line on the base substrate is overlapped with an orthographic projection of the first sub-conducting part on the base substrate to form an overlapping region, and an orthographic projection of the second end of the first sub-conducting part on the base substrate is overlapped with the orthographic projection of the second channel region of the oxide semiconductor layer of the voltage stabilizing transistor on the base substrate to form an overlapping region; and an orthographic projection of the second sub-conducting part on the base substrate is respectively overlapped with an orthographic projection of the sixth via hole on the base substrate and the orthographic projection of the third scanning line on the base substrate to form overlapping regions.

19. A display device, comprising the display panel according to claim 1.

* * * * *